United States Patent
Ishibashi et al.

(10) Patent No.: US 7,863,609 B2
(45) Date of Patent: Jan. 4, 2011

(54) COMPOUND SEMICONDUCTOR SUBSTRATE, SEMICONDUCTOR DEVICE, AND PROCESSES FOR PRODUCING THEM

(75) Inventors: Keiji Ishibashi, Itami (JP); Fumitake Nakanishi, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 12/753,535

(22) Filed: Apr. 2, 2010

(65) Prior Publication Data
US 2010/0224963 A1  Sep. 9, 2010

Related U.S. Application Data

(63) Continuation of application No. PCT/JP2009/051211, filed on Jan. 26, 2009.

(30) Foreign Application Priority Data

Jan. 19, 2009  (JP) ............................ P2009-009151

(51) Int. Cl.
*H01L 21/00* (2006.01)
*H01L 21/31* (2006.01)
*H01L 29/786* (2006.01)

(52) U.S. Cl. ........................... 257/43; 257/53; 257/577; 257/607; 257/632; 257/E21.019; 257/E21.021; 257/E21.226; 257/E21.227; 257/E21.46; 361/516; 361/522; 361/526; 438/104; 438/478; 438/680; 438/798

(58) Field of Classification Search ................... 257/43, 257/53, 577, 607, 632, E21.019, E21.021, 257/E21.226, E21.227, E21.46; 361/516, 361/522, 526; 438/104, 478, 680, 798
See application file for complete search history.

(56) References Cited

U.S. PATENT DOCUMENTS

| 6,488,767 | B1 | 12/2002 | Xu et al. | |
|---|---|---|---|---|
| 6,951,695 | B2 | 10/2005 | Xu et al. | |
| 2006/0214257 | A1* | 9/2006 | Ninomiya et al. | 257/502 |
| 2007/0178680 | A1* | 8/2007 | Aoki et al. | 438/526 |
| 2009/0203191 | A1* | 8/2009 | Ohnuma et al. | 438/458 |

FOREIGN PATENT DOCUMENTS

JP  64-87147  3/1989

(Continued)

*Primary Examiner*—Dao H Nguyen
(74) *Attorney, Agent, or Firm*—Drinker Biddle & Reath LLP

(57) ABSTRACT

A compound semiconductor substrate 10 according to the present invention is comprised of a Group III nitride and has a surface layer 12 containing a chloride of not less than $200\times10^{10}$ atoms/cm$^2$ and not more than $12000\times10^{10}$ atoms/cm$^2$ in terms of Cl and an oxide of not less than 3.0 at % and not more than 15.0 at % in terms of O, at a surface. The inventors conducted elaborate research and newly discovered that when the surface layer 12 at the surface of the compound semiconductor substrate 10 contained the chloride of not less than $200\times10^{10}$ atoms/cm$^2$ and not more than $12000\times10^{10}$ atoms/cm$^2$ in terms of Cl and the oxide of not less than 3.0 at % and not more than 15.0 at % in terms of O, Si was reduced at an interface between the compound semiconductor substrate 10 and an epitaxial layer 14 formed thereon and, as a result, the electric resistance at the interface was reduced.

9 Claims, 23 Drawing Sheets

FOREIGN PATENT DOCUMENTS

| | | |
|---|---|---|
| JP | 2599250 | 1/1997 |
| JP | 3183335 | 4/2001 |
| JP | 2001-284736 | 10/2001 |
| JP | 2001-322899 | 11/2001 |
| JP | 2003-165799 | 6/2003 |
| JP | 2003-183100 | 7/2003 |
| JP | 2006-196609 | 7/2006 |
| JP | 2006-310362 | 11/2006 |
| JP | 2007-103457 | 4/2007 |
| JP | 2008-300422 | 12/2008 |
| WO | 2008/047627 | 4/2008 |

* cited by examiner

Fig.7
(a)
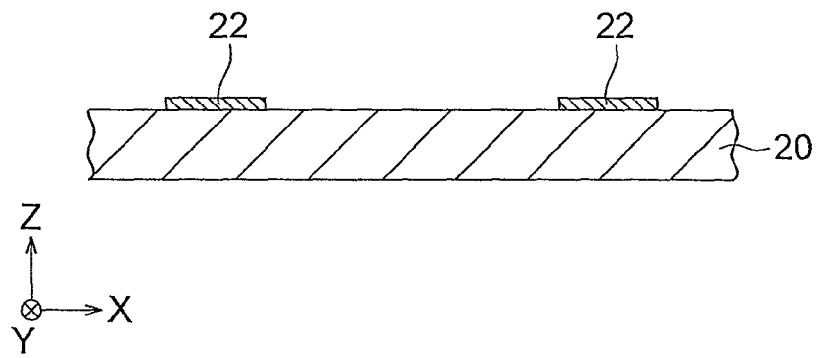
(b)
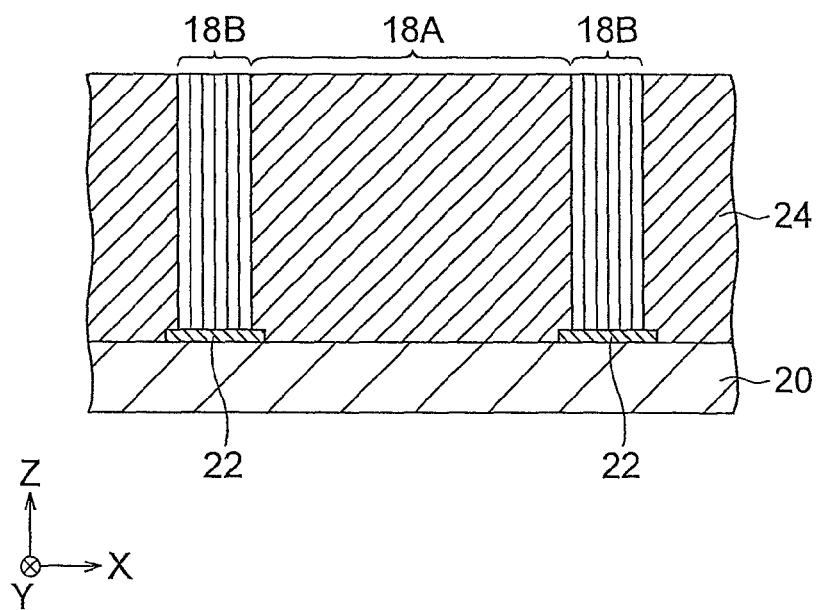

Fig.10
(a)
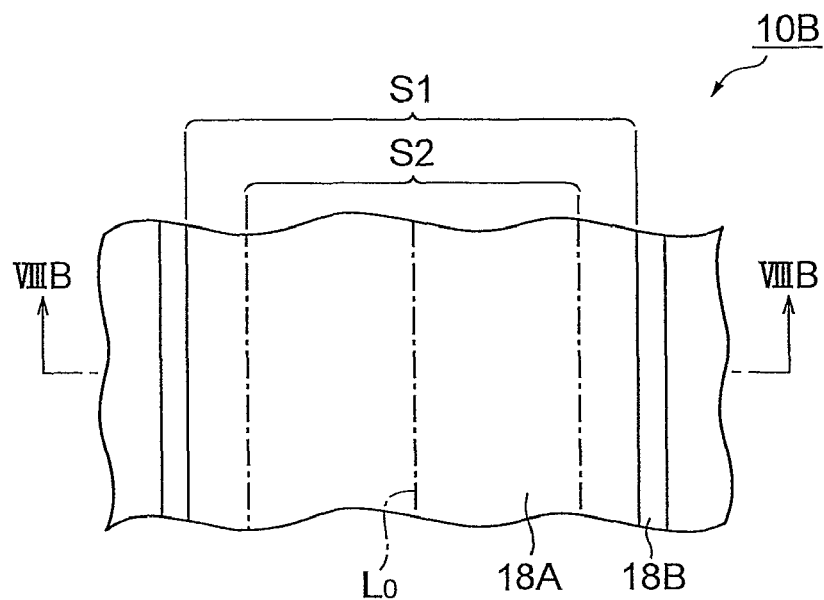
(b)
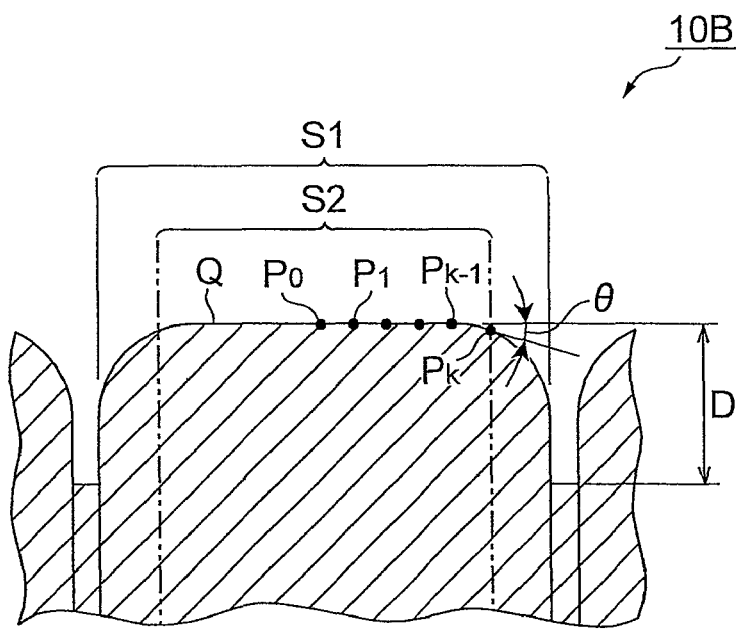

Fig.13

|  |  |  | Sample 1 | Sample 2 | Sample 3 | Sample 4 | Sample 5 | Sample 6 | Sample 7 | Sample 8 | Sample 9 | Sample 10 | Sample 11 | Sample 12 | Sample 13 |
|---|---|---|---|---|---|---|---|---|---|---|---|---|---|---|---|
| Surface quality | O amount | at% | 1.5 | 3 | 3 | 3 | 5 | 7 | 8 | 10 | 12 | 15 | 3 | 15 | 23 | 10 |
|  | Cl amount | $10^{10}$ atoms/cm² | 200 | 50 | 200 | 300 | 400 | 2000 | 5000 | 8000 | 12000 | 12000 | 200 | 12000 | 19000 |
|  | roughness Ry | nm | 33 | 33 | 34 | 32 | 32 | 31 | 33 | 34 | 36 | 33 | 33 | 35 | 34 |
|  | roughness RMS | nm | 3.2 | 3.3 | 3.3 | 3.1 | 3.1 | 3.2 | 3.3 | 3.5 | 3.4 | 3.2 | 3.2 | 3.2 | 3.2 |
| Characteristics of epitaxial layer | roughness Ry | nm | 32 | 33 | 32 | 33 | 33 | 34 | 32 | 35 | 32 | 31 | 31 | 31 | 32 |
|  | roughness RMS | nm | 3.2 | 3.2 | 3.1 | 3.2 | 3.3 | 3.3 | 3.2 | 3.4 | 3.2 | 3.1 | 3.1 | 3.1 | 3.1 |
|  | PL intensity | au | 98 | 99 | 100 | 98 | 99 | 98 | 97 | 95 | 97 | 98 | 98 | 100 | 98 |
| Device characteristics | optical output 20mA | mW | 4.3 | 5.2 | 9.2 | 11.8 | 13 | 14 | 13.1 | 12 | 9.8 | 9.2 | 9.5 | 5.7 | 4.8 |
|  | 40mA | mW | 7.4 | 8.1 | 14.3 | 18.4 | 20.5 | 22.3 | 21.2 | 19.5 | 15.2 | 14.4 | 15.3 | 7.8 | 6.7 |
|  | 4A | W | 0.42 | 0.48 | 1.4 | 2 | 2.2 | 2.4 | 2.3 | 2.1 | 1.5 | 1.4 | 1.5 | 0.45 | 0.43 |

Fig.14

| | | Sample 14 | Sample 15 | Sample 16 | Sample 17 | Sample 18 | Sample 19 |
|---|---|---|---|---|---|---|---|
| Surface quality | O amount | at% | 5 | 5 | 5 | 5 | 5 | 5 |
| | Cl amount | $10^{10}$ atoms/cm$^2$ | 350 | 350 | 350 | 350 | 350 | 350 |
| | roughness Ry | nm | 3.2 | 8.8 | 25 | 36 | 55 | 72 |
| | roughness RMS | nm | 0.3 | 1 | 3 | 3 | 5 | 7 |
| | scratch density | scratches/cm | 0.4 | 1.2 | 2 | 2.5 | 5.1 | 7.5 |
| Characteristics of epitaxial layer | roughness Ry | nm | 3 | 6.8 | 16 | 20 | 39 | 90 |
| | roughness RMS | nm | 0.28 | 0.78 | 1.8 | 2.4 | 4.2 | 8.5 |
| | PL intensity | au | 185 | 155 | 130 | 105 | 75 | 35 |
| Device characteristics | optical output 20mA | mW | 17.5 | 14.7 | 12.3 | 10.5 | 6.3 | 3.2 |
| | 40mA | mW | 28.6 | 22.4 | 18.9 | 16.8 | 9.7 | 5.2 |
| | 4A | W | 2.3 | 2 | 1.8 | 1.6 | 0.75 | 0.32 |

Fig. 15

|  |  |  | Sample 20 | Sample 21 | Sample 22 | Sample 23 |
|---|---|---|---|---|---|---|
| Surface quality | O amount | at% | 6.5 | 6 | 6 | 6 |
|  | Cl amount | $10^{10}$ atoms/cm$^2$ | 3000 | 3000 | 3000 | 3000 |
|  | pit density | pits/cm$^2$ | 10E5 | 20E5 | 50E5 | 80E5 |
| Characteristics of epitaxial layer | roughness Ry | nm | 3.2 | 5.7 | 16 | 49 |
|  | roughness RMS | nm | 0.29 | 0.52 | 1.4 | 4.5 |
|  | PL intensity | au | 190 | 155 | 120 | 85 |
| Device characteristics | optical output 20mA | mW | 16.2 | 13.4 | 11.2 | 4.8 |
|  | 4A | W | 2.5 | 2.3 | 2.1 | 0.52 |

Fig. 16

|  |  | Sample 24 | Sample 25 | Sample 26 | Sample 27 |
|---|---|---|---|---|---|
| Surface quality | O amount / at% | 12 | 12 | 12 | 12 |
|  | Cl amount / $10^{10}$ atoms/cm$^2$ | 9000 | 9000 | 9000 | 9000 |
|  | affected layer / nm | 0 | 10 | 20 | 50 |
| Characteristics of epitaxial layer | roughness Ry / nm | 5 | 12 | 25 | 97 |
|  | roughness RMS / nm | 0.45 | 0.98 | 2.9 | 8.4 |
|  | PL intensity / au | 210 | 135 | 98 | 40 |
| Device characteristics | optical output 20mA / mW | 14.7 | 12.3 | 9.2 | 2.6 |
|  | 4A / W | 2.3 | 2.1 | 1.2 | 0.22 |

Fig.17

| | | Sample 28 | Sample 29 | Sample 30 | Sample 31 |
|---|---|---|---|---|---|
| Surface quality | O amount (at%) | 15 | 15 | 15 | 15 |
| | Cl amount ($10^{10}$ atoms/cm$^2$) | 6000 | 6000 | 6000 | 6000 |
| | density of latent scratches (scratches/cm) | 0 | 10 | 40 | 100 |
| Characteristics of epitaxial layer | roughness Ry (nm) | 5.3 | 8.1 | 12 | 31 |
| | roughness RMS (nm) | 0.41 | 0.73 | 1 | 2.9 |
| | PL intensity (au) | 230 | 210 | 155 | 87 |
| Device characteristics | optical output 20mA (mW) | 15.1 | 13.2 | 11.3 | 5.2 |
| | 4A (W) | 2.4 | 2.2 | 1.8 | 0.43 |

Fig.18

| | | Sample 32 | Sample 33 | Sample 34 | Sample 35 |
|---|---|---|---|---|---|
| Surface quality | O amount (at%) | 11 | 11 | 11 | 11 |
| | Cl amount ($10^{10}$ atoms/cm$^2$) | 2500 | 2500 | 2500 | 2500 |
| Characteristics of epitaxial layer | flat surface region rate (%) | 40 | 60 | 80 | 90 |
| | roughness Ry (nm) | 1.1 | 13 | 10 | 8.6 |
| | roughness RMS (nm) | 0.98 | 1.2 | 1.1 | 0.88 |
| | PL intensity (au) | 120 | 140 | 160 | 180 |
| Device characteristics | optical output 20mA (mW) | 9.8 | 13 | 14 | 16 |
| | yield (%) | 31 | 55 | 68 | 75 |

Fig.19

| | | | Sample 36 | Sample 37 | Sample 38 | Sample 39 | Sample 40 | Sample 41 | Sample 42 | Sample 43 | Sample 44 | Sample 45 | Sample 46 | Sample 47 |
|---|---|---|---|---|---|---|---|---|---|---|---|---|---|---|
| DE conditions | volume | L | 35 | 35 | 35 | 35 | 15 | 15 | 35 | 35 | 35 | 35 | 50 | 50 |
| | pressure | Pa | 0.3 | 0.3 | 0.3 | 0.3 | 0.3 | 0.3 | 0.3 | 0.3 | 0.3 | 0.3 | 0.3 | 0.3 |
| | flow rate | sccm | 25 | 25 | 25 | 25 | 150 | 90 | 105 | 21 | 10.5 | 5.25 | 5 | 3.75 |
| | PV/Q | Pa·L/sccm | 0.42 | 0.42 | 0.42 | 0.42 | 0.03 | 0.05 | 0.1 | 0.5 | 1 | 2 | 3 | 4 |
| | bias | W | 80 | 80 | 80 | 80 | 80 | 80 | 80 | 80 | 80 | 80 | 80 | 80 |
| | antenna | W | 300 | 300 | 300 | 300 | 300 | 300 | 300 | 300 | 300 | 300 | 300 | 300 |
| | tray | material | SiC | S$_3$N$_4$ | Si | Al$_2$O$_3$ | SiC | SiC | SiC | SiC | S$_3$N$_4$ | S$_3$N$_4$ | SiC | S$_3$N$_4$ |
| Surface quality | O amount | at% | 8 | 9 | 2 | 20 | 1.8 | 3.6 | 6.2 | 8 | 9.2 | 11 | 13 | 18 |
| | Cl amount | 10$^{10}$atoms/cm$^2$ | 7000 | 8000 | 200 | 300 | 17000 | 12000 | 9000 | 7000 | 800 | 400 | 200 | 50 |
| | Si amount | at% | 0.1 | 0.1 | 0.4 | 0 | 0.1 | 0.1 | 0.1 | 0.1 | 0.1 | 0.1 | 0.1 | 0.1 |
| | roughness Ry | nm | 12 | 14 | 25 | 79 | 49 | 30 | 15 | 9 | 7.1 | 14 | 21 | 24 |
| Characteristics of epitaxial layer | roughness RMS | nm | 1.3 | 1.2 | 2.6 | 6.5 | 4.4 | 3 | 1.5 | 0.92 | 0.7 | 1.3 | 2.2 | 2.4 |
| | roughness Ry | nm | 11 | 10 | 24 | 72 | 47 | 13 | 13 | 8.8 | 6.8 | 12 | 21 | 23 |
| | roughness RMS | nm | 1 | 0.95 | 2.2 | 5.9 | 4.4 | 2.8 | 1.4 | 0.88 | 0.62 | 1.2 | 2.1 | 2.3 |
| | PL intensity | au | 135 | 140 | 110 | 22 | 72 | 105 | 120 | 140 | 170 | 130 | 110 | 110 |
| Device characteristics | optical output 20mA | mW | 12.5 | 13.4 | 4.2 | 2.9 | 4.3 | 9.5 | 12.3 | 15.2 | 15.9 | 13.1 | 10.1 | 5.3 |
| | 4A | V | 1.8 | 1.9 | 0.4 | 0.25 | 0.41 | 1.3 | 1.8 | 2.4 | 2.6 | 1.9 | 1.4 | 0.61 |

Fig.20

| | | | Sample 48 | Sample 49 | Sample 50 | Sample 51 | Sample 52 | Sample 53 | Sample 54 | Sample 55 | Sample 56 | Sample 57 | Sample 58 |
|---|---|---|---|---|---|---|---|---|---|---|---|---|---|
| Lapping | abrasive grains | material | diamond | diamond | diamond | diamond | diamond | diamond | diamond | diamond | diamond | diamond | diamond |
| | | size μm | 2 | 2 | 2 | 2 | 2 | 2 | 2 | 2 | 2 | 2 | 2 |
| | platen | material | tin | tin | tin | tin | tin | tin | tin | tin | tin | tin | tin |
| Polishing solution | pH adjustor | material | HCl | HCl | HCl | citric acid | citric acid | — | HCl | HCl | citric acid | HCl | citric acid |
| | oxidant | | TCIA | TCIA | DCIA-Na | DCIA-Na | DCIA-Na | — | — | — | Ca(ClO)₂ | — | Ca(ClO)₂ |
| | pH | | 0.5 | 1 | 1.5 | 4 | 6 | 7 | 1 | 2 | 4 | 1 | 6 |
| | ORP | mV | 1600 | 1550 | 1500 | 1350 | 1200 | 800 | 1100 | 1000 | 850 | 1100 | 1200 |
| pad | compression rate | | 3 | 3 | 3 | 3 | 3 | 3 | 3 | 3 | 3 | — | — |
| condition | pressure | g/cm² | 300 | 300 | 300 | 300 | 300 | 300 | 300 | 300 | 300 | — | — |
| substrate characteristics | composition | O amount at% | 21 | 15 | 11 | 6 | 3 | 2.4 | 11 | 9 | 3 | 1.4 | 3.3 |
| | | Cl amount 10¹⁰ atoms/cm² | 17000 | 12000 | 7000 | 300 | 200 | 50 | 10000 | 4000 | 250 | 9000 | 400 |
| | | flat surface region rate % | 40 | 60 | 80 | 90 | 95 | 100 | 68 | 85 | 94 | 100 | 100 |
| | evaluation of surface | Ry nm | 52 | 33 | 26 | 24 | 19 | 19 | 31 | 23 | 21 | 28 | 25 |
| | | Ra nm | 4.5 | 3.2 | 2.2 | 2.2 | 2 | 1.8 | 3 | 2 | 1.9 | 2.5 | 2.3 |

Fig.21

| | | | Sample 59 | Sample 60 | Sample 61 | Sample 62 | Sample 63 | Sample 64 | Sample 65 | Sample 66 | Sample 67 |
|---|---|---|---|---|---|---|---|---|---|---|---|
| Lapping | abrasive grains | material | diamond | diamond | diamond | diamond | diamond | diamond | diamond | diamond | diamond |
| | | size μm | 3 | 3 | 3 | 3 | 3 | 3 | 3 | 3 | 3 |
| | platen | material | tin alloy | tin alloy | tin alloy | tin alloy | tin alloy | tin alloy | tin alloy | tin alloy | tin alloy |
| Polishing | solution | pH adjustor | — | NaHCO$_3$ | Na$_2$CO$_3$ | KOH | KOH | KOH | Na$_2$CO$_3$ | NaHCO$_3$ | KOH |
| | | oxidant | — | Ca(ClO)$_2$ | Ca(ClO)$_2$ | Ca(ClO)$_2$ | Ca(ClO)$_2$ | TClA | DClA-Na | DClA-Na | DClA-Na |
| | | pH | 7 | 8.5 | 10 | 12 | 14 | 10 | 10 | 8.5 | 14 |
| | | ORP mV | 650 | 600 | 500 | 400 | 250 | 1050 | 950 | 600 | 750 |
| | | compression rate | 6 | 6 | 6 | 6 | 6 | 6 | — | — | — |
| | pad | | | | | | | | | | |
| | condition | pressure g/cm$^2$ | 200 | 200 | 200 | 200 | 200 | 200 | — | — | — |
| substrate characteristics | composition | O amount at% | 2.3 | 3 | 6 | 11 | 15 | 18 | 15 | 3 | 15 |
| | | Cl amount 10$^{10}$atoms/cm$^2$ | 60 | 200 | 300 | 7000 | 12000 | 15000 | 12000 | 200 | 10000 |
| | evaluation of surface | flat surface region rate % | 100 | 96 | 90 | 80 | 60 | 45 | 100 | 100 | 100 |
| | | Ry nm | 30 | 33 | 35 | 48 | 78 | 42 | 34 | 33 | 35 |
| | | Ra nm | 2.9 | 2.9 | 3 | 4.5 | 6.2 | 3.5 | 3.2 | 3.1 | 3.2 |

Fig.22

| | | | Sample 68 | Sample 69 | Sample 70 | Sample 71 | Sample 72 | Sample 73 | Sample 74 | Sample 75 | Sample 76 | Sample 77 | Sample 78 | Sample 79 | Sample 80 | Sample 81 |
|---|---|---|---|---|---|---|---|---|---|---|---|---|---|---|---|---|
| Lapping | abrasive grains | material | SiC | SiC | SiC | SiC | SiC | SiC | SiC | SiC | SiC | SiC | SiC | SiC | SiC | SiC |
| | | size μm | 3 | 3 | 3 | 3 | 3 | 3 | 3 | 3 | 3 | 3 | 3 | 3 | 3 | 3 |
| Polishing | pad | | nonwoven fabric | nonwoven fabric | nonwoven fabric | nonwoven fabric | nonwoven fabric | nonwoven fabric | nonwoven fabric | nonwoven fabric | nonwoven fabric | nonwoven fabric | nonwoven fabric | nonwoven fabric | nonwoven fabric | nonwoven fabric |
| | solution | pH adjustor | citric acid | citric acid | citric acid | citric acid | citric acid | citric acid | citric acid | citric acid | citric acid | citric acid | citric acid | citric acid | citric acid | citric acid |
| | | oxidant | TCIA | TCIA | TCIA | TCIA | TCIA | TCIA | TCIA | TCIA | TCIA | TCIA | TCIA | TCIA | TCIA | TCIA |
| | | pH | 2 | 2 | 2 | 2 | 2 | 2 | 2 | 2 | 2 | 2 | 2 | 2 | 2 | 2 |
| | | ORP mV | 1400 | 1400 | 1400 | 1400 | 1400 | 1400 | 1400 | 1400 | 1400 | 1400 | 1400 | 1400 | 1400 | 1400 |
| | pad | compression rate | 1 | 1.5 | 3 | 7 | 10 | 20 | 25 | 4 | 4 | 4 | 4 | 4 | 4 | 4 |
| | condition | pressure g/cm² | 250 | 250 | 250 | 250 | 250 | 250 | 250 | 10 | 30 | 100 | 300 | 600 | 800 | 1000 |
| substrate characteristics | composition | O amount at% | 10 | 10 | 10 | 10 | 10 | 10 | 10 | 10 | 10 | 10 | 10 | 10 | 10 | 10 |
| | | Cl amount 10¹⁰ atoms/cm² | 8000 | 8000 | 8000 | 8000 | 8000 | 8000 | 8000 | 8000 | 8000 | 8000 | 8000 | 8000 | 8000 | 8000 |
| | | Si amount at% | 0 | 0 | 0 | 0 | 0 | 0 | 0.2 | 0.3 | 0.1 | 0 | 0 | 0 | 0 | 0 |
| | | flat surface region rate % | 95 | 90 | 90 | 85 | 80 | 60 | 45 | 100 | 95 | 90 | 80 | 75 | 60 | 50 |
| evaluation of surface | | Ry nm | 42 | 30 | 28 | 24 | 23 | 25 | 28 | 23 | 22 | 24 | 32 | 28 | 30 | 47 |
| | | Ra nm | 4.5 | 3 | 2.8 | 2.6 | 2.4 | 2.7 | 2.9 | 2.1 | 2 | 2.2 | 2.8 | 2.9 | 3 | 4.3 |

Fig.23

| | | | Sample 82 | Sample 83 | Sample 84 | Sample 85 | Sample 86 | Sample 87 | Sample 88 |
|---|---|---|---|---|---|---|---|---|---|
| Polishing | solution | viscosity mPa·s | 0.5 | 2 | 5 | 7 | 10 | 30 | 50 |
| | pad | compression rate % | 8 | 8 | 8 | 8 | 8 | 8 | 8 |
| | condition | pressure g/cm² | 400 | 400 | 400 | 400 | 400 | 400 | 400 |
| substrate characteristics | composition | O amount at% | 24 | 15 | 12 | 8 | 5 | 3 | 2 |
| | | Cl amount 10¹⁰atoms/cm² | 14000 | 12000 | 8000 | 2200 | 300 | 200 | 100 |
| | flat surface region rate | Ry nm | 19 | 11 | 7.9 | 7.1 | 6.8 | 6.7 | 7.4 |
| | | Ra nm | 1.5 | 0.95 | 0.75 | 0.7 | 0.69 | 0.72 | 0.84 |

COMPOUND SEMICONDUCTOR SUBSTRATE, SEMICONDUCTOR DEVICE, AND PROCESSES FOR PRODUCING THEM

CROSS-REFERENCE TO RELATED APPLICATIONS

This is a continuation application PCT application No. PCT/JP2009/051211 filed on Jan. 26, 2009, claiming the benefit of priorities from Japanese Patent application 2009-009151 filed on Jan. 19, 2009, and incorporated by reference in their entirety.

TECHNICAL FIELD

The present invention relates to a compound semiconductor substrate having a semiconductor substrate, a semiconductor device, and processes for producing them and, more particularly, to a compound semiconductor substrate having a Group III-V compound semiconductor substrate, a semiconductor device, and processes for producing them.

BACKGROUND ART

In recent years, semiconductors including compound semiconductors are further expanding their application range by making use of various characteristics thereof. For example, the compound semiconductors are particularly useful as an underlying substrate for epitaxial growth for fabrication of high-speed devices, optical communication devices, and microwave devices.

When a semiconductor (including a compound semiconductor) is used as the underlying substrate for epitaxial growth, a surface of the semiconductor needs to be a mirror surface without distortion. For this reason, after so-called "preprocessing" such as cutting, lapping, or etching of a single-crystal ingot of the semiconductor, a resultant wafer is normally mirror-polished.

A known method of this mirror polishing is, for example, to polish the surface of the semiconductor wafer with a polishing agent containing colloidal silica (e.g., Patent Document 1 below) and thereafter clean the surface with pure water.

However, when devices were manufactured using a multilayer body in which an epitaxial layer was laid on the semiconductor substrate obtained as described above, there was the disadvantage that it was difficult to achieve a good yield, and therefore there were earnest desires for development of a semiconductor substrate free of the disadvantage.

Patent Document 1: Japanese Patent Application Laid-open No. 64-87147
Patent Document 2: Japanese Patent No. 3183335
Patent Document 3: U.S. Pat. No. 6,488,767
Patent Document 4: U.S. Pat. No. 6,951,695
Patent Document 5: Japanese Patent Application Laid-open No. 2006-310362
Patent Document 6: Japanese Patent No. 2599250

DISCLOSURE OF THE INVENTION

Problem to be Solved by the Invention

Patent Document 2 above proposes a multilayer body wherein a Si concentration at the interface between the epitaxial layer and the substrate is not more than $8 \times 10^{17}$ cm$^{-3}$, based on the presumption that Si piled up (or accumulated) at the interface between the epitaxial layer and the InP substrate caused defects in the device including the multilayer structure of epitaxial layer/InP substrate.

However, Si at the interface between the epitaxial layer and the substrate forms a high-resistance layer and the high-resistance layer degrades the electrical properties of the substrate and the device characteristics of the device fabricated from the substrate; therefore, it is preferable to reduce Si at the interface as much as possible.

The inventors conducted elaborate research and newly discovered the technology of reducing the electric resistance at the interface by reducing Si.

Namely, an object of the present invention is to provide a compound semiconductor substrate in which the electric resistance at the interface between the epitaxial layer and the substrate is reduced, a semiconductor device, and processes for producing them.

Means for Solving the Problem

A compound semiconductor substrate according to the present invention is comprised of a Group III nitride and has a surface layer containing a chloride of not less than $200 \times 10^{10}$ atoms/cm$^2$ and not more than $12000 \times 10^{10}$ atoms/cm$^2$ in terms of Cl and an oxide of not less than 3.0 at % and not more than 15.0 at % in terms of O, at a surface.

The inventors conducted elaborate research and newly discovered that when the surface layer at the surface of the compound semiconductor substrate contained the chloride of not less than $200 \times 10^{10}$ atoms/cm$^2$ and not more than $12000 \times 10^{10}$ atoms/cm$^2$ in terms of Cl and the oxide of not less than 3.0 at % and not more than 15.0 at % in terms of O, increase of Si was suppressed at the interface between the compound semiconductor substrate and the epitaxial layer formed thereon and, as a result, the electric resistance at the interface was reduced.

The surface layer preferably contains the chloride of not less than $300 \times 10^{10}$ atoms/cm$^2$ and not more than $8000 \times 10^{10}$ atoms/cm$^2$ in terms of Cl.

Furthermore, the surface layer preferably contains the oxide of not less than 5.0 at % and not more than 12.0 at % in terms of O.

It is also possible to adopt a mode wherein a surface roughness (RMS) of the surface layer is not more than 3 nm, and the surface roughness is more preferably not more than 1 nm and much more preferably not more than 0.3 nm.

It is also possible to adopt a mode wherein a density of scratches whose depth from the surface is not less than 10 nm and not more than 100 nm is not more than 2 scratches/cm, and the density is more preferably not more than 1.2 scratches/cm.

It is also possible to adopt a mode wherein a density of processed pits whose depth from the surface is not less than 2 nm and not more than 20 nm and whose diameter is not less than 0.2 μm and not more than 5 μm is not more than $50 \times 10^5$ pits/cm$^2$.

It is also possible to adopt a mode wherein a maximum depth of scratches in a circular region in a central portion except for a peripheral portion 5 mm wide at the surface is not more than 100 nm.

It is also possible to adopt a mode wherein a density of latent scratches at the surface is not more than 40 scratches/cm.

It is also possible to adopt a mode having an affected layer at the surface, wherein a thickness of the affected layer is not more than 20 nm.

It is also possible to adopt a mode wherein the semiconductor substrate has a structure in which low dislocation density regions and high dislocation density regions are alternately arranged.

It is also possible to adopt a mode wherein a flat surface region rate of the semiconductor substrate is not less than 60%.

It is also possible to adopt a mode further comprising an epitaxial layer formed on the surface layer and comprised of a Group III nitride.

A process for producing a compound semiconductor substrate according to the present invention comprises a step of forming a surface layer containing a chloride of not less than $200 \times 10^{10}$ atoms/cm$^2$ and not more than $12000 \times 10^{10}$ atoms/cm$^2$ in terms of Cl and an oxide of not less than 3.0 at % and not more than 15.0 at % in terms of O, at a surface of a compound semiconductor substrate comprised of a Group III nitride.

The inventors conducted elaborate research and newly discovered that when the surface layer containing the chloride of not less than $200 \times 10^{10}$ atoms/cm$^2$ and not more than $12000 \times 10^{10}$ atoms/cm$^2$ in terms of Cl and the oxide of not less than 3.0 at % and not more than 15.0 at % in terms of O was formed at the surface of the compound semiconductor substrate, Si was reduced at the interface between the compound semiconductor substrate and the epitaxial layer formed thereon and, as a result, the electric resistance at the interface was reduced.

It is also possible to adopt a mode wherein a surface roughness (RMS) of the surface layer is not more than 3 nm.

It is also possible to adopt a mode wherein the surface layer is formed by dry etching of the compound semiconductor substrate with a chlorine-based gas in a chamber in which a compound containing the Si element and at least one element selected from the group consisting of C, N, and O, exists.

It is also possible to adopt a mode wherein the dry etching is reactive ion etching, and wherein conditions of the etching satisfy a relation of the following formula:

$$0.05 \leq PV/Q \leq 3.0,$$

where P (Pa) is a pressure in the chamber, Q (sccm) is a gas flow rate, and V (L) is a volume of the chamber.

It is also possible to adopt a mode wherein the surface layer is formed by a surface treatment of the compound semiconductor substrate of which the surface is polished, using a solution satisfying relations of the following two formulae:

$$-50x+1000<y<-50x+1800 (1 \leq x \leq 6) \quad (1);$$

$$-50x+800<y<-50x+1500 (8.5 \leq x \leq 14) \quad (2),$$

wherein x is pH and y (mV) is an oxidation-reduction potential, the solution having a viscosity of not less than 2 mPa·s and not more than 30 mPa·s and containing a chlorine-based compound.

It is also possible to adopt a mode wherein the solution containing the chlorine-based compound is a solution containing a compound comprising only an element of H, C, O, N, and Cl, and pure water, and wherein polishing is carried out as the surface treatment under a pressure of not less than 30 g/cm$^2$ and not more than 800 g/cm$^2$ using a polishing pad of which a compression rate is not less than 1.5% and not more than 20%.

It is also possible to adopt a mode comprising a step of forming an epitaxial layer comprised of a Group III nitride, on the surface layer.

A semiconductor device according to the present invention comprises: a compound semiconductor substrate comprised of a Group III nitride and having a surface layer containing a chloride of not less than $200 \times 10^{10}$ atoms/cm$^2$ and not more than $12000 \times 10^{10}$ atoms/cm$^2$ in terms of Cl and an oxide of not less than 3.0 at % and not more than 15.0 at % in terms of O, at a surface, the compound semiconductor substrate having an epitaxial layer formed on the surface layer and comprised of a Group III nitride; and an electrode formed on at least one of a top surface and a bottom surface of the compound semiconductor substrate.

The inventors conducted elaborate research and newly discovered that when the surface layer containing the chloride of not less than $200 \times 10^{10}$ atoms/cm$^2$ and not more than $12000 \times 10^{10}$ atoms/cm$^2$ in terms of Cl and the oxide of not less than 3.0 at % and not more than 15.0 at % in terms of O was formed at the surface of the compound semiconductor substrate, Si was reduced at the interface between the compound semiconductor substrate and the epitaxial layer formed thereon and, as a result, the electric resistance at the interface was reduced.

A process for producing a semiconductor device according to the present invention is a process for producing a semiconductor device comprising a compound semiconductor substrate comprised of a Group III nitride, the process comprising: a step of forming an epitaxial layer comprised of a Group III nitride, on a surface layer of the compound semiconductor substrate having the surface layer containing a chloride of less than $200 \times 10^{10}$ atoms/cm$^2$ and not more than $12000 \times 10^{10}$ atoms/cm$^2$ in terms of Cl and an oxide of not less than 3.0 at % and not more than 15.0 at % in terms of O, at a surface; and a step of forming an electrode on at least one of a top surface and a bottom surface of the compound semiconductor substrate.

The inventors conducted elaborate research and newly discovered that when the epitaxial layer was formed on the compound semiconductor substrate comprised of the Group III nitride and having the surface layer containing the chloride of not less than $200 \times 10^{10}$ atoms/cm$^2$ and not more than $12000 \times 10^{10}$ atoms/cm$^2$ in terms of Cl and the oxide of not less than 3.0 at % and not more than 15.0 at % in terms of O, at the surface, Si was reduced at the interface between the compound semiconductor substrate and the epitaxial layer and, as a result, the electric resistance at the interface was reduced.

An amount of Si in the surface layer of the compound semiconductor substrate is preferably not more than 0.3 at % and more preferably not more than 0.2 at %.

A compound semiconductor substrate according to the present invention is one wherein a concentration of Cl atoms at an interface between a base substrate and an epitaxial layer comprised of a Group III nitride is not less than $5 \times 10^{15}$ atoms/cm$^3$ and not more than $1 \times 10^{18}$ atoms/cm$^3$.

A compound semiconductor substrate according to the present invention is one wherein a concentration of O atoms at an interface between a base substrate and an epitaxial layer comprised of a Group III nitride is not less than $5 \times 10^{16}$ atoms/cm$^3$ and not more than $1 \times 10^{18}$ atoms/cm$^3$.

A compound semiconductor substrate according to the present invention is one wherein a concentration of Si atoms at an interface between a base substrate and an epitaxial layer comprised of a Group III nitride is not less than $1 \times 10^{15}$ atoms/cm$^3$ and not more than $5 \times 10^{19}$ atoms/cm$^3$.

A semiconductor device according to the present invention comprises the compound semiconductor substrate as defined above, and an electrode formed on at least one of a top surface and a bottom surface of the compound semiconductor substrate.

Patent Documents 3 and 4 above show that a smooth surface with the surface roughness (RMS) of not more than 1 nm is obtained by chemical mechanical polishing (CMP) of a surface of $Al_xGa_yIn_zN$ using $SiO_2$ abrasive grains. However, they mention nothing about decrease in impurities in the surface and describe nothing about control of the composition of the surface layer. Patent Document 5 shows that the polishing rate is improved and the affected layer is reduced by controlling pH and the oxidation-reduction potential of the polishing solution of CMP. However, it fails to mention the decrease in impurities in the surface and describes nothing about the control of the composition of the surface layer. Furthermore, Patent Document 6 above shows that a surface of a GaN substrate can be processed into a smooth surface by letting a Si piece exist in a system during dry etching of the surface of the GaN substrate with a chlorine-based gas. However, it mentions nothing about the decrease in impurities in the surface and describes nothing about the control of the composition of the surface layer.

Effect of the Invention

The present invention provides the compound semiconductor substrate in which the electric resistance is reduced at the interface between the epitaxial layer and the substrate, the semiconductor device, and the production processes thereof.

BRIEF DESCRIPTION OF THE DRAWINGS

FIG. 7 is a drawing showing a procedure of fabricating the semiconductor substrate shown in FIG. 6.

FIG. 10 is a drawing showing a flat surface region in the compound semiconductor substrate shown in FIG. 6, wherein (a) is a plan view and (b) a drawing showing a sectional view along line VIIIB-VIIIB in (a).

FIG. 13 is a table showing the data according to Example 1 of the present invention.

FIG. 14 is a table showing the data according to Example 2 of the present invention.

FIG. 15 is a table showing the data according to Example 3 of the present invention.

FIG. 16 is a table showing the data according to Example 4 of the present invention.

FIG. 17 is a table showing the data according to Example 5 of the present invention.

FIG. 18 is a table showing the data according to Example 6 of the present invention.

FIG. 19 is a table showing the data according to Example 7 of the present invention.

FIG. 20 is a table showing the data according to Example 8 of the present invention.

FIG. 21 is a table showing the data according to Example 9 of the present invention.

FIG. 22 is a table showing the data according to Example 10 of the present invention.

FIG. 23 is a table showing the data according to Example 11 of the present invention.

LIST OF REFERENCE SYMBOLS 10, 10A, 10B compound semiconductor substrate; 12 surface layer; 14 epitaxial layer; 18A low dislocation density regions; 18B high dislocation density regions; 30 semiconductor device; 32A and 32B electrodes.

BEST MODES FOR CARRYING OUT THE INVENTION

The modes assumed to be the best for carrying out the present invention will be described below in detail with reference to the accompanying drawings. Identical or equivalent elements will be denoted by the same reference symbols and the description thereof will be omitted if it is redundant.

Figure 1:
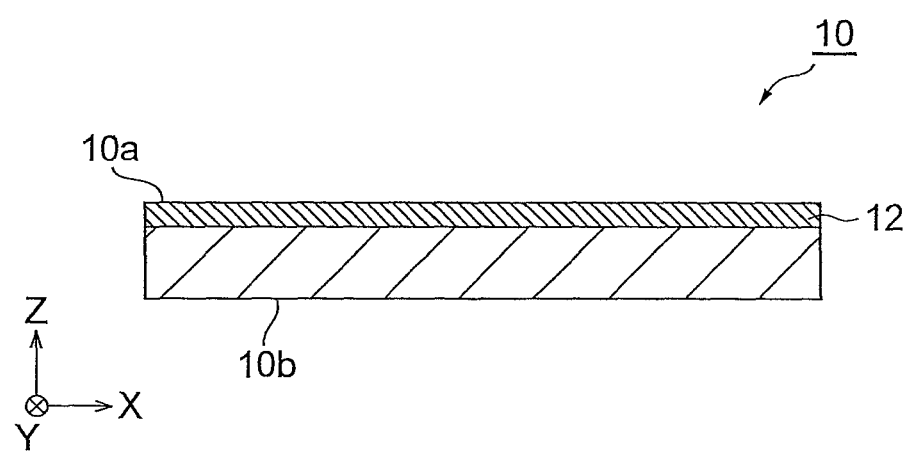
FIG. 1 is a drawing showing a schematic sectional view of a compound semiconductor substrate according to an embodiment of the present invention.

FIG. 1 is a schematic sectional view of a compound semiconductor substrate 10 according to a first embodiment. As shown in FIG. 1, the compound semiconductor substrate 10 has a configuration wherein a surface layer 12 is formed at a surface on one side.

The compound semiconductor substrate 10 is comprised of a Group HT nitride (e.g., GaN, AlN, InN, AlGaN, or InGaN). In the GaN case, it is grown by the HVPE method, flux method, or ammonothermal method and in the AlN case, it is grown by the HVPE method, sublimation method, or flux method. InN is grown by the HVPE method.

The surface layer 12 is a layer containing a chloride and an oxide and is comprised, for example, of $Al_xGa_yIn_zN_aO_bCl_c$ (x+y+z=1 and a+b+c=1).

The compound semiconductor substrate 10 is a substrate for epitaxial growth of a desired semiconductor layer thereon and an important point herein is the quality of the surface of the substrate. This surface quality, different from the quality of a bulk crystal, is readily affected by a surface composition or roughness, and an affected layer. Particularly, in cases where the substrate is used in fabrication of light emitting devices such as LEDs or semiconductor lasers, it is important that a layer with a high electric resistance (which will be referred to hereinafter as a high-resistance layer) be not formed at an interface between the substrate and an epitaxial layer grown thereon. An increase in electric resistance of a light emitting device will lead to a decrease in luminous efficiency. The luminous efficiency is heavily lowered, particularly, with injection of a large electric current.

The affected layer herein refers to a layer in which the crystal lattice formed in the surface-side region of the crystal is disordered by grinding or polishing of the crystal surface, and the existence and thickness of the layer can be confirmed by TEM observation of a cross section made by breaking the crystal along a cleavage plane. The thickness of the affected layer is preferably not more than 20 nm and more preferably not more than 10 nm. If the thickness of the affected layer is too large, it will lead to deterioration of morphology and crystallinity in epitaxial growth.

The inventors newly discovered that formation of the aforementioned high-resistance layer could be restrained by controlling an existing amount of Si in the surface $10a$ of the compound semiconductor substrate 10 and letting the Cl element and O element exist in the form of a chloride and an oxide on the compound semiconductor substrate 10.

Specifically, we discovered that the formation of the high-resistance layer could be restrained when the surface layer 12 at the surface $10a$ of the compound semiconductor substrate 10 contained the chloride of not less than $200 \times 10^{10}$ atoms/cm$^2$ and not more than $12000 \times 10^{10}$ atoms/cm$^2$ in terms of Cl and the oxide of not less than 3.0 at % and not more than 15.0 at % in terms of O. The surface layer 12 preferably contains the chloride of not less than $300 \times 10^{10}$ atoms/cm$^2$ and not more than $8000 \times 10^{10}$ atoms/cm$^2$ and more preferably contains the chloride of not less than $400 \times 10^{10}$ atoms/cm$^2$ and not more than $5000 \times 10^{10}$ atoms/cm$^2$ in terms of Cl. The surface layer 12 preferably contains the oxide of not less than 5.0 at % and not more than 12.0 at % and more preferably contains the oxide of not less than 7.0 at % and not more than 10.0 at % in terms of O.

The surface roughness Ry of the compound semiconductor substrate 10 is preferably not more than 30 nm. The surface roughness Ry herein is defined as follows: a 10 μm square (10 μm×10 μm=100 μm$^2$, the same will also apply hereinafter) as a standard area in directions of a mean surface is extracted from a roughness curved surface, a sum is calculated of a height of a highest peak and a depth of a lowest valley from a mean surface of the extracted part, and the sum is defined as the surface roughness Ry. When the surface roughness Ry is not more than 30 nm, an epitaxial layer with good morphology and crystallinity can be formed on the principal surface. From such a viewpoint, the surface roughness Ry is more preferably not more than 10 nm.

The surface roughness RMS of the compound semiconductor substrate 10 is preferably not more than 3 nm. The surface roughness RMS herein is defined as follows: a 10 μm square as a standard area in directions of a mean surface is extracted from a roughness curved surface, absolute values of deviations from a mean surface of the extracted part to a measured curved surface are summed up, the total is averaged by the standard area, and the resultant value is defined as the surface roughness RMS. When the surface roughness RMS is not more than 3 nm, an epitaxial layer with good morphology and crystallinity can be formed. From such a viewpoint, the surface roughness RMS is more preferably not more than 1 nm.

In the compound semiconductor substrate 10, a density of scratches whose depth from the surface is not less than 10 nm and not more than 100 nm is preferably not more than 2 scratches/cm and more preferably not more than 1.2 scratches/cm. The scratch density is evaluated as a line density which is the number of scratches intersecting with a unit length. The scratches are linear depressions on the surface and the scratch density can be controlled by a polishing condition and/or a dry etching condition. If the scratch density is too large, it will lead to deterioration of the qualities of morphology and crystallinity in epitaxial growth. The scratch density can be evaluated with an optical interferometry type roughness meter and a differential interference microscope.

In the compound semiconductor substrate 10, a density of processed pits whose depth from the surface is not less than 2 nm and not more than 20 nm and whose diameter is not less than 0.2 μm and not more than 5 μm is preferably not more than $50 \times 10^5$ pits/cm$^2$. The diameter of processed pits is normally not less than 0.5 μm and not more than 2 μm. The density of processed pits is more preferably not more than $20 \times 10^5$ pits/cm$^2$ and much more preferably not more than $10 \times 10^5$ pits/cm$^2$. The processed pits are fine depressions on the surface and the pit density can be controlled by a polishing condition and/or a dry etching condition. They are different from depressions in dislocation concentrated portions of crystal. If the pit density is too high, it will lead to deterioration of the qualities of morphology and crystallinity in epitaxial growth. The pit density can be evaluated with an optical interferometry type roughness meter, a differential interference microscope, and an SEM.

In the compound semiconductor substrate 10, a density of latent scratches by ultraviolet fluorescence observation or cathode luminescence (CL hereinafter) observation is preferably not more than 40 scratches/cm. The density of latent scratches is evaluated as a line density which is the number of latent scratches intersecting with a unit length. When the density of latent scratches is not more than 40 scratches/cm, an epitaxial layer with good morphology and crystallinity can be formed and therefore a semiconductor device with excellent properties can be obtained. From such a viewpoint, the density of latent scratches is more preferably not more than 10 scratches/cm. The latent scratches herein can be observed by ultraviolet fluorescence observation or CL observation.

The ultraviolet fluorescence observation is to observe fluorescence of an energy (wavelength) corresponding to the bandgap of the Group III nitride crystal with incidence of excitation light of a sufficiently higher energy (lower wavelength) than the bandgap of the Group III nitride crystal of the compound semiconductor substrate 10. For example, the excitation light to be used is an emission line of mercury (wavelength: 337 nm) or a He—Cd laser (wavelength: 325 nm) and fluorescence of the GaN crystal (wavelength: 365 nm) is observed. When the ultraviolet fluorescence observation of the Group III nitride crystal is carried out, fluorescence is observed in crystal regions in a good surface condition, no fluorescence is observed in regions of the affected layer of disordered crystal, and the latent scratches are observed as black linear shadows.

Since the ultraviolet fluorescence observation can be performed even in a state in which the Group III nitride crystal is fixed on a crystal holder for surface treatment, the surface condition of the Group III nitride crystal can be observed at each of steps in the surface treatment of the Group III nitride crystal and it thus becomes easier to identify a problem at each step. When the ultraviolet fluorescence observation is carried out using a device as a combination of an ultraviolet fluorescence microscope and an optical microscope (particularly, preferably a differential interference microscope), an identical field can be observed in comparison and it is thus feasible to perform comparative observation of unevenness information of the surface such as scratches and information about the interior of the processed surface layer such as latent scratches.

The CL observation is to observe visible light or light of a wavelength close to the visible wavelength region emitted with incidence of an electron beam as excitation light into the III nitride crystal. When the cathode luminescence observation of the Group III nitride crystal is carried out, light is observed in crystal regions in a good surface condition, no light is observed in regions of the affected layer of disordered crystal, and the latent scratches are observed as black linear shadows.

When the CL observation device is used in combination with an SEM (scanning electron microscope), it allows observation at a high magnification and thus enables observation of fine latent scratches. By making a comparison between a CL image and an SEM image, it becomes feasible to perform comparative observation of the unevenness information of the surface such as scratches and the information about the interior of the processed surface layer such as latent scratches.

A procedure of fabricating the compound semiconductor substrate 10 will be described below with reference to FIG. 8.

First, a crystal of a Group III nitride is grown and the crystal is then shaped by periphery processing to obtain an ingot of the Group III nitride. Then the resultant ingot is cut by a wire saw or a blade saw to obtain the compound semiconductor substrate 10 of the Group III nitride. Furthermore, a grinding process (grinding) or a lapping process is carried out to flatten the surface 10a of the compound semiconductor substrate 10.

The grinding can be performed using a grinding stone containing hard abrasive grains of diamond, SiC, BN, $Al_2O_3$, $Cr_2O_3$, or $ZrO_2$, and the lapping process can be performed using a general polishing agent containing hard abrasive grains of diamond, SiC, BN, $Al_2O_3$, $Cr_2O_3$, or $ZrO_2$. The polishing agent is selected in view of mechanical action/properties. For example, abrasive grains with high hardness and large grain sizes are used in order to increase a polishing rate, whereas abrasive grains with low hardness and small grain sizes are used in order to smooth the surface roughness and reduce the affected layer due to processing. For reducing the polishing time and obtaining a smooth surface, it is preferable to adopt multi-stage polishing with change of abrasive grains from large grain sizes to small grain sizes.

Next, the surface 10a of the compound semiconductor substrate 10 after completion of the lapping process is subjected to a surface finish. This surface finish process is to carry out CMP or dry etching, for reduction of roughness and removal of the affected layer. Use of a chlorine-based gas is effective to the dry etching of nitrides like GaN. With the chlorine-based gas, a high etching rate is achieved and the surface layer 12 containing a chloride can be formed at the surface. The chlorine-based gas to be used can be, for example, $Cl_2$, HCl, $CCl_4$, $BCl_3$, $SiCl_4$, or $SiHCl_3$. By adjusting the type of gas, the flow rate, the pressure in a chamber, and/or the power of etching, it is possible to control an amount of chlorine in the surface layer 12 and to control the pit density of the surface layer 12.

The surface 10a of the compound semiconductor substrate 10 is preferably one whose plane direction is one of the C plane, A plane (11-20), R plane (10-12), M plane (10-10), (20-21) plane, S plane (10-11), (11-21) plane, (11-22) plane, and (11-24) plane of the wurtzite structure. Since the planes except for the Ga face of the C plane have lower chemical durability than the Ga face of the C plane, they are effective to improvement in rate of CMP.

When the compound semiconductor substrate 10 has the wurtzite structure, it has polarities in the [0001] direction (c-axis direction). In this case, the c axis is referred to as a polar axis. A plane perpendicular to this polar axis (c axis) is referred to as a polar face. Namely, the polar face is defined as a face perpendicular to the direction of polarization. A face parallel to the polar axis is called a nonpolar face. A face obliquely crossing the polar axis is called a semipolar face. When semiconductor devices such as LEDs and LDs (laser diodes) are fabricated using the compound semiconductor substrate 10 whose principal surface is the nonpolar face (e.g., the M plane, the A plane, or the like), they achieve high luminous efficiencies and a blue shift of emission wavelength (i.e., a shift to the shorter wavelength side) is suppressed even with increase in current density of an applied electric current. In fabrication of semiconductor devices, where an epitaxial layer with good crystal quality is expected to grow on the principal surface 10a of the compound semiconductor substrate 10, or where it is desired to increase an incorporation amount of In in an InGaN layer, the principal surface 10a is preferably one of the (20-21) plane, S plane, R plane, (11-21) plane, (11-22) plane, and (11-24) plane being the semipolar faces. In view of the crystal quality and the incorporation amount of In, the principal surface is allowed to have an off-angle of not more than 15° relative to each plane direction. In fabrication of LDs, an end face of a resonator is preferably the M plane or the C plane with a cleavage property and it is thus preferable to use the compound semiconductor substrate 10 having the principal surface perpendicular to the M plane (e.g., the A plane, (11-21) plane, (11-22) plane, or the like) or the principal surface perpendicular to the C plane (e.g., the M plane, A plane, or the like). In terms of the cleavage property, the principal surface can be formed with an off-angle of not more than 5° relative to each plane direction.

The surface finish may include polishing with soft abrasive grains, thereby realizing further reduction in surface roughness and the affected layer. The soft abrasive grains to be used can be abrasive grains selected from $ZrO_2$, $SiO_2$, $CeO_2$, $MnO_2$, $Fe_2O_3$, $Fe_3O_4$, NiO, ZnO, CoO, $Co_3O_4$, $GeO_2$, $Ga_2O_3$, and $In_2O_3$. For enhancing cleaning performance of polishing, the metal element of the abrasive grains is preferably one with a high ionization tendency and removal efficiency by cleaning becomes higher with metals having a higher ionization tendency than H. When a surfactant is added in a polishing solution, it is feasible to reduce residual abrasive grains. For reducing the metal element in the surface layer 12, it is effective to perform polishing with a polishing solution containing no abrasive grains, after completion of the polishing with abrasive grains. For removing $SiO_2$, it is effective to perform washing with hydrofluoric acid after the polishing.

For forming the surface layer in a desired composition, the aforementioned surface treatment can be performed using a solution containing no abrasive grains. The chemical action of the solution in the surface treatment is adjusted by pH or an oxidation-reduction potential. When an acid containing chlorine such as HCl is used for pH adjustment, a chlorine concentration in the surface layer 12 can be controlled. Furthermore, by increasing the oxidation-reduction potential with use of an oxidant, it is feasible to increase the polishing rate and to control an oxygen concentration at the surface.

When the value of pH is x and the value of the oxidation-reduction potential is y (mV), the following relation is preferably satisfied under an acid condition of $1 \leq x \leq 6$:

$$-50x+1000<y<-50x+1800;$$

the following relation is preferably satisfied under an alkaline condition of $8.5 \leq x \leq 14$:

$$-50x+800<y<-50x+1500.$$

There are no particular restrictions on the aforementioned oxidant, but, from the viewpoint of enhancing the oxidation-reduction potential, oxidants to be preferably used include the following compounds: hypochlorites such as hypochlorous acid, sodium hypochlorite, and calcium hypochlorite; chlorinated isocyanuric acids such as trichloroisocyanuric acid; chlorinated isocyanurates such as sodium dichloroisocyanurate; permanganates such as potassium permanganate;

dichromates such as potassium dichromate; bromates such as potassium bromate; thiosulfates such as sodium thiosulfate; persulfates such as ammonium persulfate and potassium persulfate; nitric acid, hydrogen peroxide water, and ozone. When a chlorine-based oxidant is used, the surface layer 12 containing the chloride can be formed on the substrate after polished. Examples of the chlorine-based oxidant include sodium hypochlorite, sodium dichloroisocyanurate, trichloroisocyanuric acid, and so on.

The chlorine concentration and oxygen concentration in the surface layer can be controlled by controlling the viscosity of the surface treatment solution. The viscosity of the surface treatment solution is preferably not less than 2 mPa·s and not more than 30 mPa·s and more preferably not less than 5 mPa·s and not more than 10 mPa·s. When the viscosity of the solution is lower than 2 mP·s, the chlorine concentration and oxygen concentration in the surface layer become higher than the aforementioned desired values. When the viscosity of the solution is higher than 30 mP·s, the chlorine concentration and oxygen concentration in the surface layer become lower than the aforementioned desired values. The viscosity of the solution can be adjusted by adding an organic compound with high viscosity such as ethylene glycol or an inorganic compound such as boehmite.

For etching the surface 10a of the compound semiconductor substrate 10 into a flat surface, it is effective to perform the etching in the presence of a Si-based gas or a Si piece, but a large ratio of Si will raise a problem of increase in an amount of Si adhering to the surface of the substrate after the dry etching. With use of a compound containing the Si element and at least one element selected from the group consisting of C, N, and O, e.g., SiC, $Si_3N_4$, or $Si_{6-z}Al_zO_zN_{8-z}$, it becomes feasible to etch the surface 10a flat and to control the deposition of Si. When an area ratio of SiC is reduced relative to the substrate 10 to be etched, residual Si on the surface 10a can be reduced. Furthermore, residual Si can be reduced and the etching rate is lowered by adjusting the gas flow rate, the pressure in the chamber, and the etching power.

For obtaining a better surface layer 12, the foregoing dry etching is preferably reactive ion etching and conditions of the etching preferably satisfy the relation of $0.05 \leq PV/Q \leq 3.0$, where P (Pa) is the pressure in the chamber, Q (sccm) is the gas flow rate, and V (L) is the chamber volume. When PV/Q is smaller than 0.05, the oxygen amount reduces, the chlorine amount increases, and the surface roughness increases. When PV/Q is larger than 3.0 on the other hand, the oxygen amount increases while the chlorine amount decreases.

The inventors newly discovered that Si decreased at the interface between the compound semiconductor substrate 10 and the epitaxial layer formed thereon and, as a result, the electric resistance at the interface decreased, in the compound semiconductor substrate 10 in which the surface layer 12 containing the chloride and oxide was formed in the lapping process and the surface finish, as described above.

The off-angle, which is an angle between the substrate surface 10a of the compound semiconductor substrate 10 and one of the aforementioned crystallographic planes in the wurtzite structure, is preferably not less than 0.05° and not more than 15° and more preferably not less than 0.1° and not more than 10°. The larger the off-angle, the more the removal effect of abrasive grains. When the off-angle is not less than 0.05°, defects in the epitaxial layer can be reduced; when it is not more than 15°, the epitaxial layer with good morphology and crystallinity becomes more likely to be formed on the compound semiconductor substrate 10. When the off-angle exceeds 15°, it becomes easier for a stepwise level difference to be formed in the epitaxial layer. The larger the off-angle, the more the removal effect of abrasive grains. Formation of the good epitaxial film makes it feasible to achieve a high efficiency, high output, and long lifetime for semiconductor devices fabricated using the compound semiconductor substrate 10.

High-performance semiconductor devices are obtained by forming the epitaxial layer with good morphology and crystallinity on the surface 10a of the compound semiconductor substrate 10 as described above. The provision of the foregoing off-angle increases the polishing rate and suppresses preferential removal in dislocation concentrated portions of the substrate to restrain occurrence of depressions, thereby facilitating formation of a smooth surface.

In the composition of the surface layer 12, quantities of Si and Cl can be determined by the TXRF analysis (Total reflection X-Ray Fluorescence analysis) or AES (Auger Electron Spectroscopy analysis). This TXRF allows high-accuracy evaluation of a monoatomic layer at the surface. Quantity of O can be determined by AES or XPS. This ABS has the resolution of 0.1%. The difference in composition between the part of the surface layer 12 and the other part in the compound semiconductor substrate 10 can be evaluated by performing an analysis in the depth direction by SIMS (Secondary Ion Mass Spectrometry). Differences in composition among the epitaxial growth layer, the interface, and the base substrate can also be evaluated by SIMS.

Figure 2:
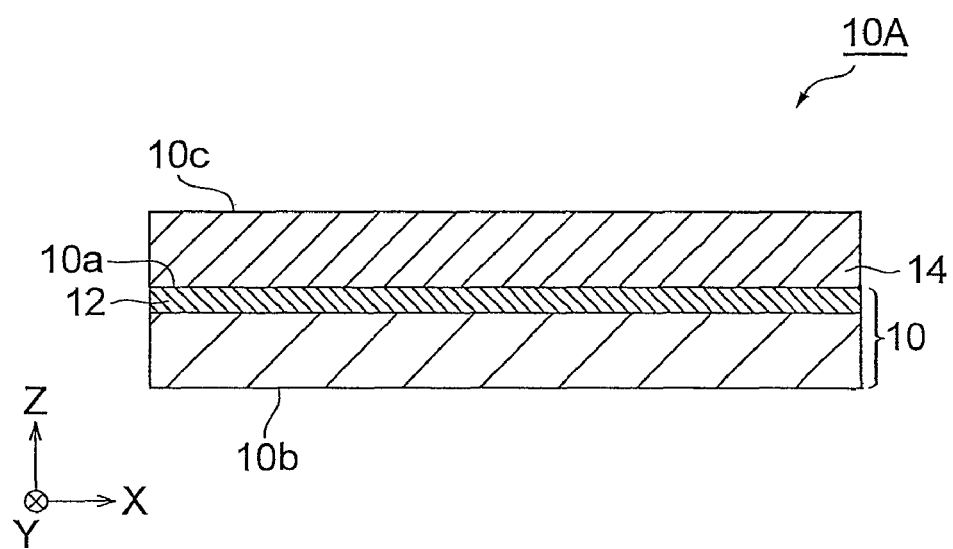
FIG. 2 is a schematic sectional view of a compound semiconductor substrate in a mode different from the compound semiconductor substrate shown in FIG. 1.

The compound semiconductor substrate may be a compound semiconductor substrate 10A in a mode wherein an epitaxial layer 14 is laid on the surface 10a of the compound semiconductor substrate 10, as shown in FIG. 2. The epitaxial layer 14 is comprised, for example, of a Group III nitride, GaN. In this compound semiconductor substrate 10A, reduction in the electric resistance is really achieved at the interface between the semiconductor substrate 10 and the epitaxial layer 14 formed thereon.

Since the compound semiconductor substrate 10A includes the compound semiconductor substrate 10 comprised of the group III nitride and containing the chloride of not less than $200 \times 10^{10}$ atoms/$cm^2$ and not more than $12000 \times 10^{10}$ atoms/$cm^2$ in terms of Cl and the oxide of not less than 3.0 atoms/$cm^2$ and not more than 15.0 at % in terms of O, at the surface, and at least one layer of a Group III nitride epitaxially grown on the surface of the compound semiconductor substrate 10, the intensity of light emitted by the PL (photoluminescence) method (PL intensity) is high.

In the compound semiconductor substrate 10A, a concentration of Cl atoms at the interface between the base substrate 10 and the epitaxial layer 14 comprised of the Group III nitride (GaN) is preferably not less than $5 \times 10^{15}$ atoms/$cm^3$ and not more than $1 \times 10^{18}$ atoms/$cm^3$ and more preferably not less than $1 \times 10^{16}$ atoms/$cm^3$ and not more than $5 \times 10^{17}$ atoms/$cm^3$.

In the compound semiconductor substrate 10A, a concentration of O atoms at the interface between the base substrate 10 and the epitaxial layer 14 comprised of the Group III nitride (GaN) is preferably not less than $5 \times 10^{16}$ atoms/$cm^3$ and not more than $1 \times 10^{18}$ atoms/$cm^3$ and more preferably not less than $1 \times 10^{17}$ atoms/$cm^3$ and not more than $5 \times 10^{17}$ atoms/$cm^3$.

In the compound semiconductor substrate 10A, a concentration of Si atoms at the interface between the base substrate 10 and the epitaxial layer 14 comprised of the Group III nitride (GaN) is preferably not less than $\times 10^{15}$ atoms/$cm^3$ and not more than $5 \times 10^{19}$ atoms/$cm^3$ and more preferably not less than $1 \times 10^{15}$ atoms/$cm^3$ and not more than $1 \times 10^{19}$ atoms/$cm^3$.

In the compound semiconductor substrate 10A, a concentration of H atoms at the interface between the base substrate 10 and the epitaxial layer 14 comprised of the Group III nitride (GaN) is preferably not less than $2 \times 10^{17}$ atoms/cm$^3$ and not more than $1 \times 10^{18}$ atoms/cm$^3$.

Thereby, it achieves the reduction in electric resistance at the interface between the semiconductor substrate 10 and the epitaxial layer 14 formed thereon.

Figure 3:
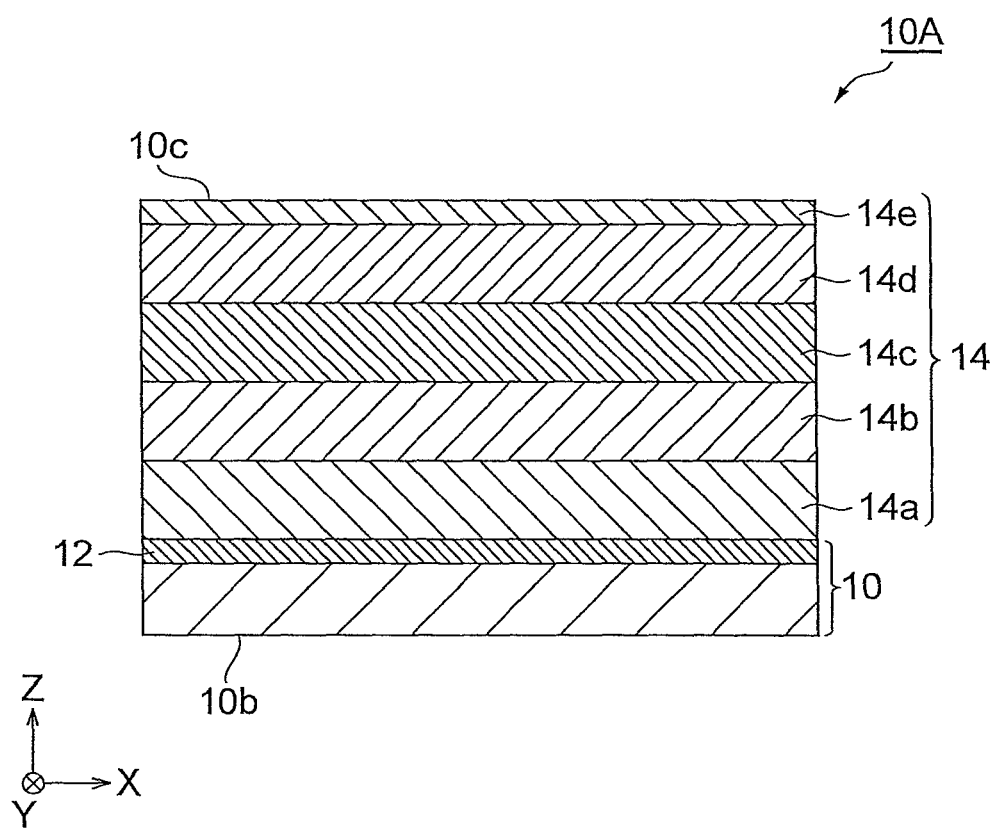
FIG. 3 is a schematic sectional view of a compound semiconductor substrate in a mode different from the compound semiconductor substrate shown in FIG. 2.

The compound semiconductor substrate 10A can be a compound semiconductor substrate 10A as shown in FIG. 3, as another embodiment. The compound semiconductor substrate 10A shown in FIG. 3 includes at least one epitaxially grown layer of a Group III nitride consisting of a 1-µm-thick n-type GaN layer 14a and a 150-nm-thick n-type Al$_{0.1}$Ga$_{0.9}$N layer 14b as n-type semiconductor layers, a light emitting layer 14c, and a 20-nm-thick p-type Al$_{0.2}$Ga$_{0.8}$N layer 14d and a 150-nm-thick p-type GaN layer 14e as p-type semiconductor layers which are deposited in the order named, on the surface layer 12 of the n-type GaN crystal substrate (compound semiconductor substrate) 10. The light emitting layer herein has a multiple quantum well structure in which four barrier layers formed as 10-nm-thick GaN layers and three well layers formed as 3-nm-thick Ga$_{0.85}$In$_{0.15}$N layers are alternately stacked.

Since at least one Group III nitride layer is epitaxially grown on the surface layer 12 of the compound semiconductor substrate 10 in production of the compound semiconductor substrate 10A shown in FIG. 3, the compound semiconductor substrate 10A is obtained with high intensity of light emitted by the PL method (PL intensity). More specifically, for example, the n-type GaN crystal substrate (compound semiconductor substrate) 10 is placed in an MOCVD system and the n-type GaN layer 14a, n-type Al$_{0.1}$Ga$_{0.9}$N layer 14b, light emitting layer 14c, p-type Al$_{0.2}$Ga$_{0.8}$N layer 14d, and p-type GaN layer 14e are successively epitaxially grown by the MOCVD (Metal Organic Chemical Vapor Deposition) method on the surface layer 12 of the n-type GaN crystal substrate 10.

Figure 4:
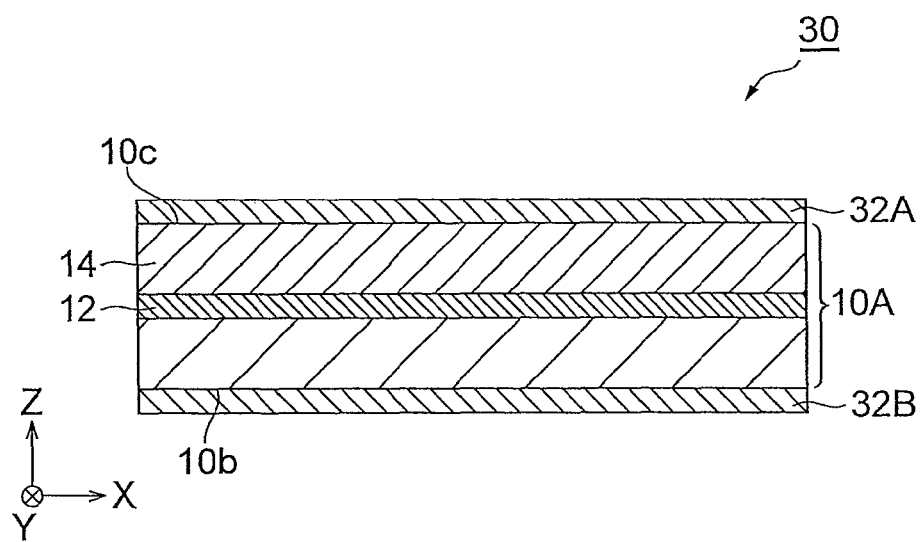
FIG. 4 is a drawing showing a schematic sectional view of a semiconductor device according to an embodiment of the present invention.

Predetermined electrodes 32A, 32B are formed on the aforementioned compound semiconductor substrate 10 or 10A, as shown in FIG. 4, to obtain a semiconductor device 30. One electrode 32A is formed on the epitaxial layer 14 and the other electrode 32B is formed on the back 12b of the semiconductor substrate 10 by metal evaporation or the like. The formation of electrodes 32A, 32B can be optionally modified as needed, but the electrode is formed on at least either one of the semiconductor substrate 10 and the epitaxial layer 14.

The semiconductor device 30 has the compound semiconductor substrate 10A which is the compound semiconductor substrate comprised of the Group III nitride and having the surface layer 12 containing the chloride of not less than $200 \times 10^{10}$ atoms/cm$^2$ and not more than $12000 \times 10^{10}$ atoms/cm$^2$ in terms of Cl and the oxide of not less than 3.0 at % and not more than 15.0 at % in terms of O, at the surface and which has the epitaxial layer 14 formed on the surface layer 12 and comprised of the Group III nitride, and the electrodes formed on the top surface 10c and the bottom face 10b of the compound semiconductor substrate 10A, whereby the luminescence intensity is enhanced.

Figure 5:
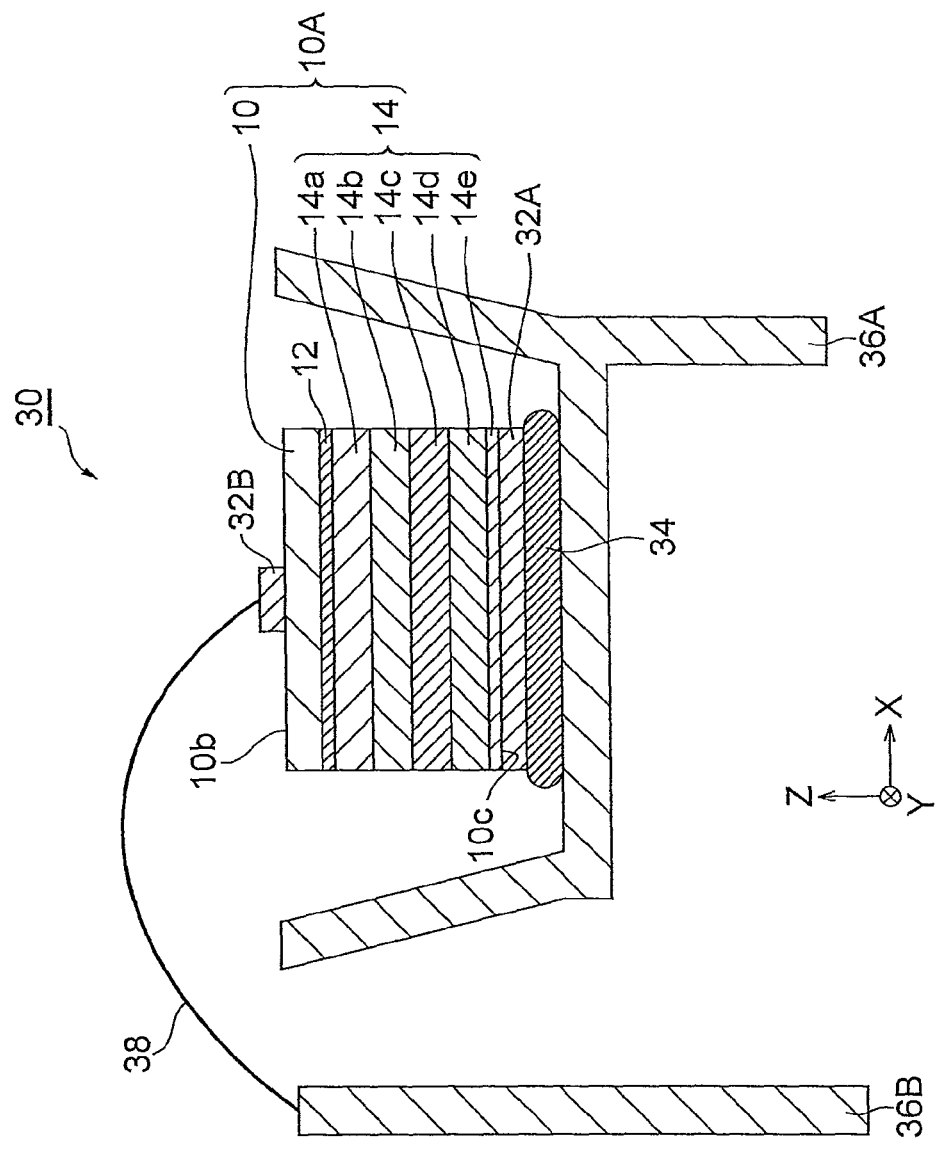
FIG. 5 is a schematic sectional view of a semiconductor device in a mode different from the semiconductor device shown in FIG. 4.

The semiconductor device 30 can be a semiconductor device 30 as shown in FIG. 5, as another embodiment. The semiconductor device 30 shown in FIG. 5 includes at least one epitaxially grown Group III nitride layer consisting of a 1-µm-thick n-type GaN layer 14a and a 150-nm-thick n-type Al$_{0.1}$Ga$_{0.9}$N layer 14b as n-type semiconductor layers, a light emitting layer 14c, and a 20-nm-thick p-type Al$_{0.2}$Ga$_{0.8}$N layer 14d and a 150-nm-thick p-type GaN layer 14e as p-type semiconductor layers which are deposited in the order named, on the surface layer 12 of the n-type GaN crystal substrate (compound semiconductor substrate) 10. The light emitting layer herein has a multiple quantum well structure in which four barrier layers formed as 10-nm-thick GaN layers and three well layers formed as 3-nm-thick Ga$_{0.85}$In$_{0.15}$N layers are alternately stacked.

The compound semiconductor device 30 has electrodes formed on a top surface 10c of the outermost layer of the compound semiconductor substrate 10A and on at least one surface 10b of the compound semiconductor substrate 10, a second electrode (p-side electrode) 32A laid on the p-type GaN layer 14e being the outermost layer and a first electrode (n-side electrode) 32B laid on the other principal surface of the compound semiconductor substrate 10.

The semiconductor device 30 including an LED (light emitting diode, the same will also apply hereinafter) is configured as follows: the second electrode (p-side electrode) 32A is bonded through a solder layer 34 to a conductive body 36A and the first electrode (n-side electrode) 32B is bonded through a wire 38 to a conductive body 36B.

A process for producing the semiconductor device 30 shown in FIG. 5 includes a step of epitaxially growing at least one Group III nitride layer on the surface layer 12 of the compound semiconductor substrate 10; and a step of forming the electrodes on the outermost layer of the Group III nitride layer and on at least one surface of the compound semiconductor substrate 10. It provides the semiconductor device 30 with a good yield. More specifically, for example, the n-type GaN crystal substrate 10 is placed in an MOCVD system and the n-type GaN layer 14a, n-type Al$_{0.1}$Ga$_{0.9}$N layer 14b, light emitting layer 14c, p-type Al$_{0.2}$Ga$_{0.8}$N layer 14d, and p-type GaN layer 14e are successively epitaxially grown by the MOCVD (Metal Organic Chemical Vapor Deposition) method on the surface layer 12 of the n-type GaN crystal substrate 10.

Next, the 100-µm-diameter n-side electrode 32B is formed as the first electrode on the other principal surface 10b of the n-type GaN crystal substrate 10. On the other hand, the p-side electrode 32A is formed as the second electrode on the p-type GaN layer 14e. The multilayer body is cut into a chip 400 µm square or 2 mm square to obtain an LED (light emitting diode).

Thereafter, the p-side electrode 32A is bonded to the conductive body 36A by the solder layer 34 and the n-side electrode 32B is bonded to the conductive body 36B by the wire 38, thereby obtaining the semiconductor device 30 including the LED.

Figure 6:
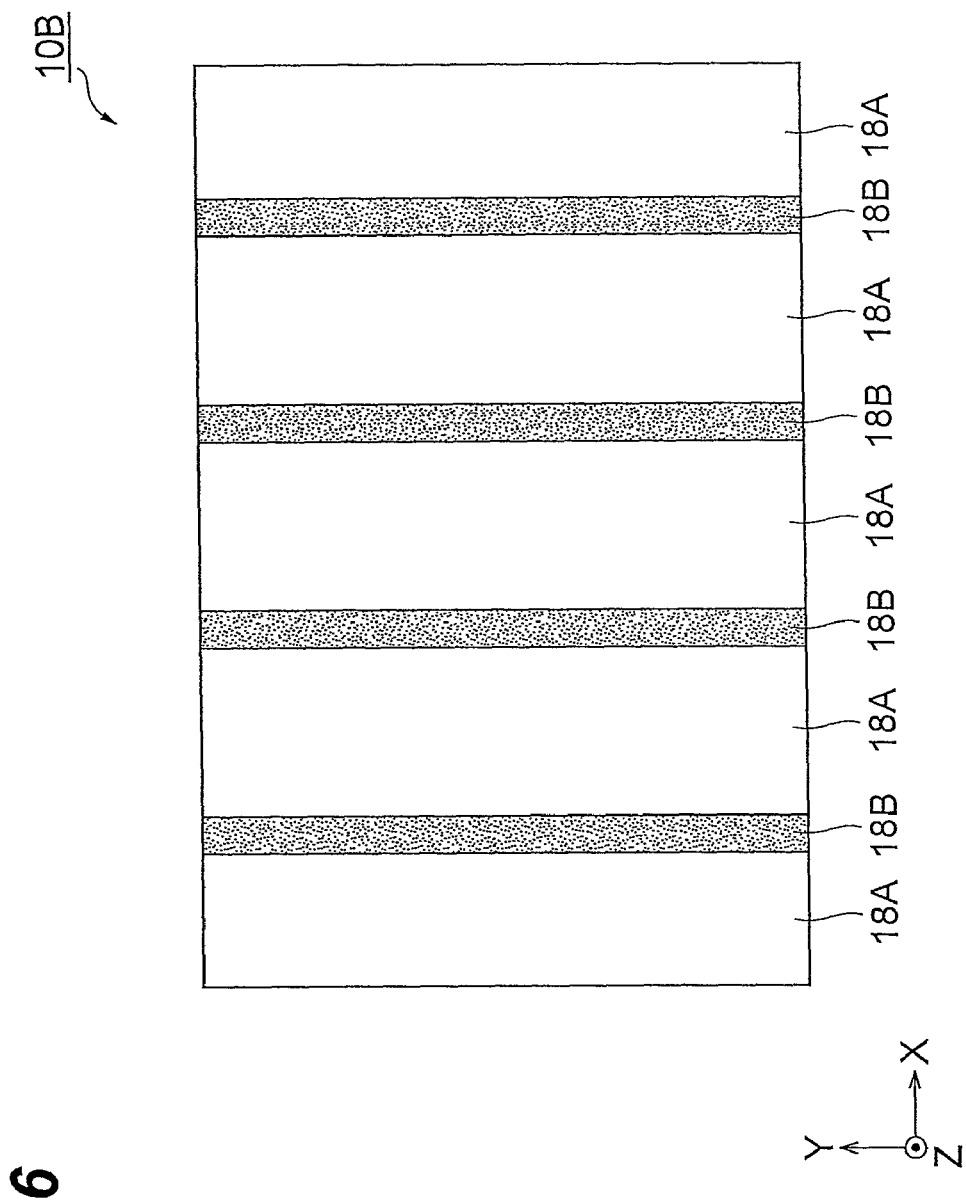
FIG. 6 is a plan view showing a semiconductor substrate in a mode different from the semiconductor substrate shown in FIG. 1.

Furthermore, a compound semiconductor substrate 10B as shown in FIG. 6 may be used instead of the above-described compound semiconductor substrate 10 or 10A. The growth of Group III nitride crystal is sometimes carried out in the following manner in order to reduce the dislocation density in the crystal: a mask layer of SiO$_2$ or the like having apertures is formed on an underlying substrate and facet growth of the Group III nitride crystal is carried out thereon (e.g., Japanese Patent Application Laid-open No. 2003-165799, Japanese Patent Application Laid-open No. 2003-183100, and so on).

This compound semiconductor substrate 10B is a GaN substrate having a stripe structure in which low dislocation density regions 18A and high dislocation density regions 18B linearly extending in the same direction (Y-direction in FIG. 6) are alternately arranged. The high dislocation density regions and the low dislocation density regions in the compound semiconductor substrate (which will also be referred to hereinafter as a Group III nitride crystal) 10B can be observed by CL observation (S-4300 available from Hitachi, Ltd.).

The compound semiconductor substrate 10B can be manufactured according to a procedure as described below.

First, as shown in FIG. 7 (a), mask layers 22 are formed in stripe patterns on a predetermined single-crystal substrate 20. Then, as shown in FIG. 7 (b), a GaN layer 24 is epitaxially grown by vapor growth on the single-crystal substrate 20 with the mask layers 22 formed thereon. The vapor growth to be used herein can be the HVPE method, MOCVD method, VOC method, MBE method, sublimation method, or the like. As the GaN layer 24 is grown into a thick film by facet growth, the mask layers 22 become covered by the GaN layer 24, to obtain the GaN layer 24 in which high dislocation density regions 18B are formed in portions corresponding to the mask layers 22. The high dislocation density regions 18B are portions (stripe cores) in which crystal defects (threading dislocations) of the GaN layer 24 are concentrated to make the density of defects considerably higher than in the other portions.

Figure 8:
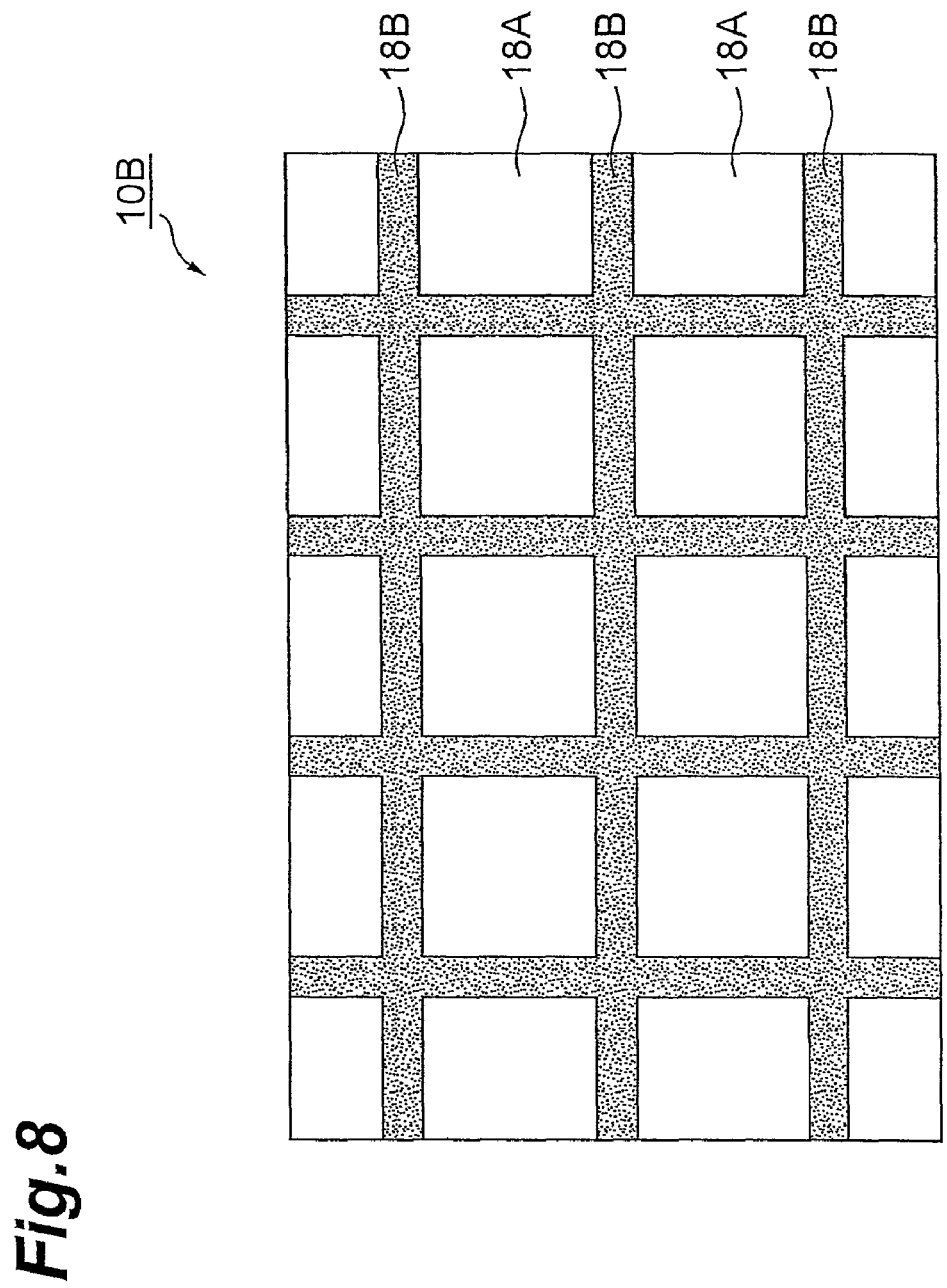
FIG. 8 is a plan view showing a semiconductor substrate in a mode different from the semiconductor substrate shown in FIG. 6.
Figure 9:
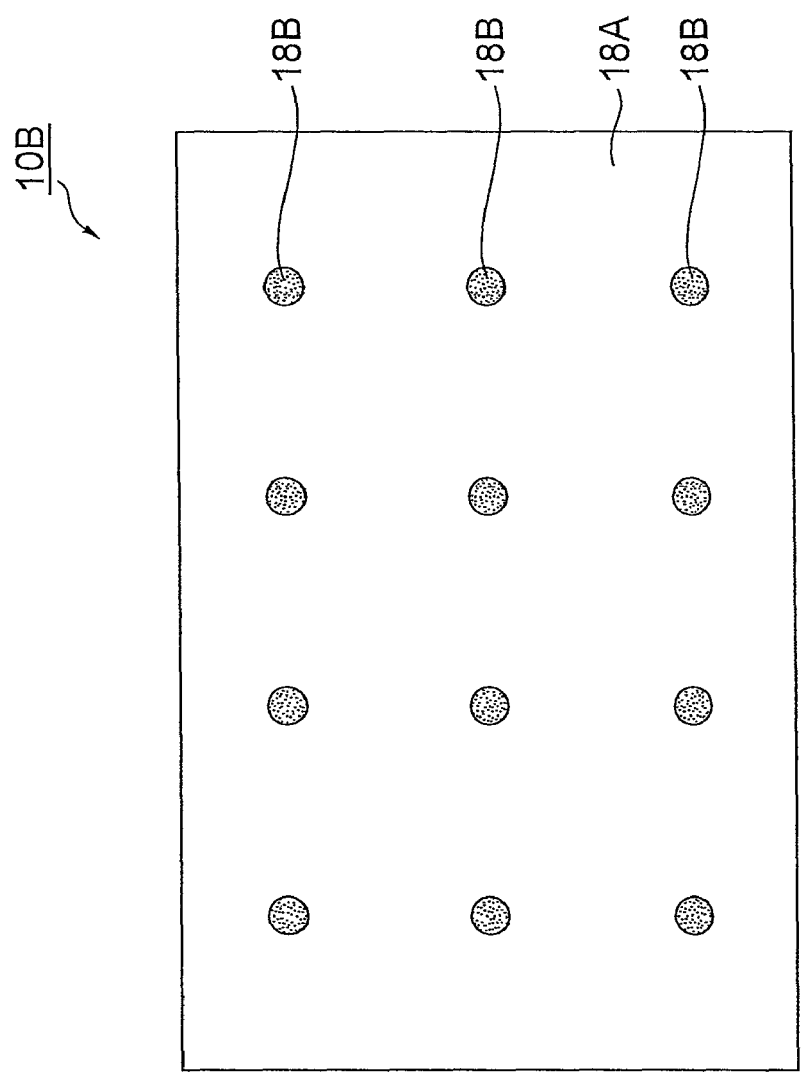
FIG. 9 is a plan view showing a semiconductor substrate in a mode different from the semiconductor substrate shown in FIG. 6.

The high dislocation density regions 18B do not have to be limited to the foregoing stripe structure, but they may be formed in a square structure in which stripes intersect perpendicularly with each other as shown in FIG. 8, or in a dot structure in which dots are regularly arrayed as shown in FIG. 9. In the square structure or the dot structure, as in the stripe structure, the shape of high dislocation density regions 18B can be controlled by the patterning shape of the mask layers 22 on the single-crystal substrate 20 being the underlying substrate.

In the Group III nitride crystal 10B grown by the foregoing facet growth method, surfaces of the low dislocation density regions are Ga atom surfaces, while surfaces of the high dislocation density regions are N atom surfaces. For this reason, the surfaces of the high dislocation density regions demonstrate a larger rate of chemical polishing than the surfaces of the low dislocation density regions. Therefore, when the surface of the Group III nitride crystal 10B including the high dislocation density regions and the low dislocation density regions is subjected to chemical polishing such as CMP or abrasive-free polishing, the surfaces of the high dislocation density regions become more depressed than the surfaces of the low dislocation density regions.

After the growth of the Group III nitride crystal, the crystal is shaped by periphery processing to obtain an ingot of the Group III nitride. The resultant ingot is cut in parallel to the substrate surface (X-Y plane) by a wire saw or a blade saw and the surface 10a is subjected to a grinding process (grinding) or a lapping process for flattening it, to form the aforementioned surface layer 12, thereby obtaining the compound semiconductor substrate 10B shown in FIG. 6.

Flat surface regions in the compound semiconductor substrate 10B will be described below with reference to FIG. 10.

A flat surface region in a low dislocation density region 18A of the compound semiconductor substrate 10B is defined as follows: when point $P_1$, point $P_2$, ..., point $P_{k-1}$, and point $P_k$ (where k is a positive integer) are set at intervals of a fixed distance of 10 μm from a highest point $P_0$ or highest line $L_0$ of the surface of the low dislocation density region 18A to the outer edge of the low dislocation density region 18A, the flat surface region is defined as a surface region where there is an arbitrary point $P_k$ where an inclination angle θ of a straight line including point $P_{k-1}$ and point $P_k$ is less than 0.1°, relative to a reference plane Q tangent to the surface of the low dislocation density region 18A at the highest point $P_0$ or highest line $L_0$ of the surface.

Such a flat surface region continuously exists from the central part of the surface of the low dislocation density region 18A to the outer edges. Since the high dislocation density regions 18B are more likely to be removed during polishing, the outer edge portions of the low dislocation density regions 18A located near the high dislocation density regions 18B are more preferentially removed than the center portions of the low dislocation density regions 18A, so as to cause shape rounding. For this reason, the aforementioned inclination angle θ becomes larger and there appear regions where the inclination angle is not less than 0.1°. Let us define a flat surface region rate (unit: %) as a rate (percentage) of area S2 of the flat surface region of the low dislocation density region 18A to an area of an overall surface S1 in the low dislocation density region 18A.

This flat surface region rate (=S2/S1×100) is preferably not less than 60% and more preferably not less than 80%. It is much more preferably not less than 90%.

A compression rate of a pad during the CMP and abrasive-free polishing of the compound semiconductor substrate 10B is preferably not less than 1.5% and not more than 20%. If the compression rate of the polishing pad is smaller than 1.5%, the surface roughnesses RMS and Ry of the surface layer 12 will become large. If the compression rate of the polishing pad is larger than 20%, the effect of the surface will become reduced so as to make depressions greater in the surfaces of the high dislocation density regions 18B of the compound semiconductor substrate 10B and thus make the flat surface regions smaller in the surfaces of the low dislocation density regions 18A. From such a viewpoint, the compression rate of the polishing pad used in the polishing step is more preferably not less than 3% and not more than 10%.

From the foregoing viewpoint, the polishing pad is preferably made of polyurethane, polyester, polyether, polycarbonate, or the like and has a form of suede, nonwoven fabric, foamed body (foam), or the like.

In the present specification, the compression rate of the polishing pad herein is defined by the following equation:

Compression rate (%)=$(T_1-T_2)/T_2 \times 100$, using the thickness $T_1$ of the pad at one minute after an initial weight $W_1$ is loaded on the pad, and the thickness $T_2$ of the pad at one minute after the weight is increased to $W_2$. In calculation of the compression rate, the initial weight $W_1$ was 100 g and the weight $W_2$ 1600 g.

If the pad is a soft one, selective removal of stripe cores increases so as to increase the core depth and rounding of the peripheral portions around the cores. In addition, it increases the shape rounding of the periphery of the substrate. If the pad is a hard one on the other hand, it will deteriorate the quality of the surface of the substrate.

The pressure in the CMP and abrasive-free polishing is preferably not less than 30 g/cm$^2$ and not more than 800 g/cm$^2$ and more preferably not less than 100 g/cm$^2$ and not more than 600 g/cm$^2$. If the pressure is too small, the polishing rate becomes insufficient in practical use; if the pressure is too large, the quality of the surface of the substrate will deteriorate. In addition, it will result in decrease in the flat surface region rate in the surfaces of the low dislocation density regions 18A.

The chemical action of the polishing solution can be adjusted by pH of the solution or an oxidant. The pH is preferably in the range of not less than 1 and not more than 6 or in the range of not less than 8.5 and not more than 14 and more preferably in the range of not less than 1.5 and not more than 4 or in the range of not less than 10 and not more than 13. By adding the oxidant, it is feasible to increase the oxidation-reduction potential and to improve the removal effect of abrasive grains. In the alkaline region, selective removal of stripe cores becomes greater. When the oxidation-reduction potential is high, the core depth and the flat surface region rate degrade.

For adjusting pH, the following compounds may be used: inorganic acids such as hydrochloric acid, nitric acid, sulfuric acid, and phosphoric acid; organic acids such as formic acid, acetic acid, citric acid, malic acid, tartaric acid, succinic acid, phthalic acid, maleic acid, and fumaric acid; alkalis such as KOH, NaOH, $NH_4OH$, organic alkalis, and amines; and salts such as sulfates, carbonates, and phosphates. The pH can also be controlled by addition of an oxidant.

When an organic acid is used for adjustment of pH of the slurry, the impurity removal effect can be improved even at the same pH when compared with inorganic acids and inorganic salts. Among the organic acids, it is preferable to use a dicarboxylic acid (acid with two carboxyl groups).

EXAMPLES

The present invention will be described in further detail, based on Examples and Comparative Examples below.

Example 1

(1-1) Lapping of Surface of n-Type GaN Crystal

An n-type GaN crystal (dopant: Si) grown by the HVPE method was sliced along a face parallel to the (0001) plane to obtain an n-type GaN crystal substrate of 50 mm in diameter× 0.5 mm in thickness. The c plane ((000-1) plane) on the N atom surface side of this n-type GaN crystal substrate (nitride crystal) was attached to a ceramic crystal holder with wax. A platen of 380 mm in diameter was set on a lapping machine and lapping of the surface of the n-type GaN crystal (the c plane on the Ga atom surface side, (0001) plane) was carried out in such a manner that while a slurry with diamond abrasive grains dispersed was supplied from a slurry supply port onto the platen, the platen was rotated about a rotational axis thereof and while the n-type GaN crystal substrate was pushed against the platen with a weight on the crystal holder, the n-type GaN crystal substrate was rotated about a rotational axis of the crystal holder.

The platen used herein was a copper platen or a tin platen. The abrasive grains prepared herein were three types of diamond abrasive grains with abrasive grain sizes of 9 μm, 3 μm, and 2 μm, and they were used while decreasing the abrasive grain sizes in stages with progress of lapping. The polishing pressure was not less than 9.8 kPa (100 gf/cm$^2$) and not more than 49 kPa (500 gf/cm$^2$) and the numbers of rotations of the n-type GaN crystal substrate (nitride crystal 1) and the platen both were not less than 30 rotations/min and not more than 100 rotations/min. The lapping resulted in turning the surface of the n-type GaN crystal substrate into a mirror surface.

(1-2) CMP of Surface of n-Type GaN Crystal

Figure 11:
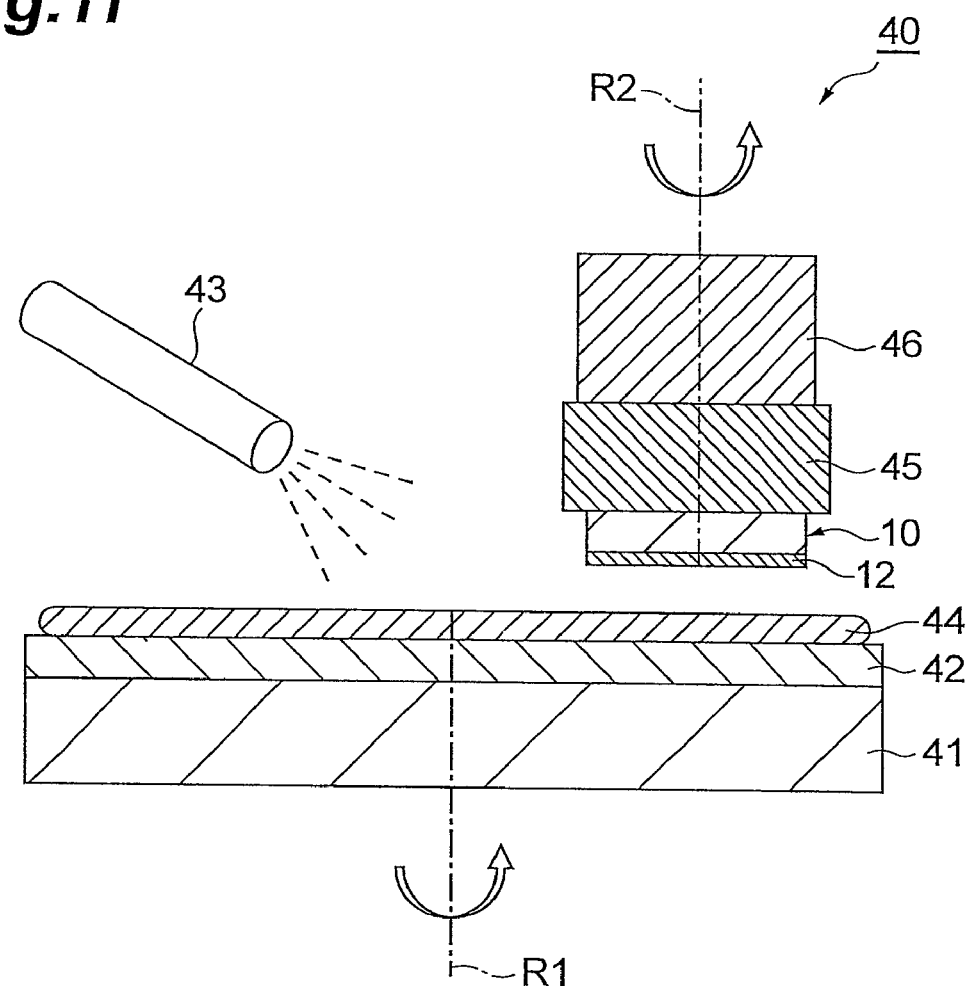
FIG. 11 is a schematic configuration diagram of a polishing machine according to an embodiment of the present invention.

As shown in FIG. 11, a polishing pad 42 was set on a platen 41 of 380 mm in diameter installed in a polishing machine 40 and CMP of the surface (the c plane on the Ga atom surface side or the (0001) plane) of the n-type GaN crystal 10 was carried out in such a manner that while a slurry 44 with abrasive grains dispersed was supplied from a slurry solution supply port 43 to the polishing pad 42, the polishing pad 42 was rotated about a rotational axis R1 and while the n-type GaN crystal substrate 10 was pushed against the polishing pad 42 with a weight 46 loaded on a crystal holder 45, the n-type GaN crystal substrate 10 was rotated about a rotational axis R2 of the crystal holder 45.

The slurry herein was prepared as follows: $Al_2O_3$ (Mohs hardness 9) particles with the grain size of 2 μm as abrasive grains were dispersed in an $Al_2O_3$ content of 5 mass % in water, and sodium dichloroisocyanurate (DCIA-Na hereinafter) as an oxidant and $HNO_3$ as a pH adjuster were added to adjust pH in the range of not less than 1 and not more than 4.5 and the oxidation-reduction potential in the range of not less than 1000 mV and not more than 1500 mV. The polishing pad used was a suede pad of polyurethane (Supreme RN-R available from Nitta Haas Incorporated) and the platen used was a stainless steel platen. The polishing pressure was not less than 9.8 kPa (100 gf/cm$^2$) and not more than 78 kPa (800 gf/cm$^2$) and the numbers of rotations of the n-type GaN crystal substrate and the polishing pad both were not less than 30 rotations/min and not more than 120 rotations/min.

The surface roughness Ry and the surface roughness RMS of the n-type GaN crystal substrate were evaluated by observation with an AFM (Atomic Force Microscope) in the range of 10 μm×10 μm in the surface of the n-type GaN crystal substrate. The oxygen amount in the surface layer was evaluated by AES and the chlorine amount by TXRF.

(1-3) Abrasive-free Polishing of Surface of n-Type GaN Crystal

The abrasive-free polishing was carried out with a solution containing no abrasive grains, using a polishing machine similar to that in the CMP described above. The polishing solution was prepared in such a manner that trichloroisocyanuric acid (TCIA hereinafter) as an oxidant and HCl as a pH adjuster were added to adjust pH in the range of not less than 1 and not more than 2.5 and the oxidation-reduction potential in the range of not less than 1200 mV and not more than 1500 mV. Ethylene glycol was also added in the polishing solution to adjust the viscosity in the range of not less than 2 mPa·s and not more than 10 mPa·s. The polishing pad used was a nonwoven fabric pad (compression rate 3.0%) and the platen used was an aluminum platen after subjected to a surface treatment. The polishing pressure was not less than 39 kPa (400 gf/cm$^2$) and not more than 78 kPa (800 gf/cm$^2$) and the numbers of rotations of the n-type GaN crystal substrate and the polishing pad both were not less than 80 rotations/min and not more than 100 rotations/min.

(1-4) Fabrication of Semiconductor Device Including n-Type GaN Crystal Substrate The n-type GaN crystal substrate after the above-described CMP was placed in an MOCVD system and a 1-μm-thick n-type GaN layer (dopant: Si) and a 150-nm-thick n-type $Al_{0.1}Ga_{0.9}N$ layer (dopant: Si) as n-type semiconductor layers, a light emitting layer, and a 20-nm-thick p-type $Al_{0.2}Ga_{0.8}N$ layer (dopant: Mg) and a 150-nm-thick p-type GaN layer (dopant: Mg) as p-type semiconductor layers were successively formed by the MOCVD method on one principal surface (the (0001) plane subjected to the CMP) side of the n-type GaN crystal substrate to obtain a compound semiconductor substrate including an epitaxial growth layer. The light emitting layer herein had the multiple quantum well structure in which four bather layers formed as 10-nm-thick GaN layers and three well layers formed as 3-nm-thick $Ga_{0.85}In_{0.15}N$ layers were alternately stacked. The surface roughnesses and PL intensity were evaluated for the epitaxial growth layer. The PL intensity evaluation was carried out by evaluating the intensity at the wavelength of 460 nm, using a He—Cd laser of the wavelength of 325 nm as an excitation light source. The SIMS analysis was carried out to determine the composition at the interface between the base substrate and the epitaxial growth layer.

Next, the n-side electrode of 100 μm in diameter was formed as the first electrode on the other principal surface ((000-1) plane) side of the n-type GaN crystal substrate by forming a multilayer structure consisting of a 200-nm-thick Ti layer, a 1000-nm-thick Al layer, a 200-nm-thick Ti layer, and a 2000-nm-thick Au layer and heating it in a nitrogen atmosphere. On the other hand, the p-side electrode was formed as the second electrode on the p-type GaN layer by forming a multilayer structure consisting of a 4-nm-thick Ni layer and a 4-nm-thick Au layer and heating it in an inert gas atmosphere. The foregoing semiconductor substrate was cut into chips 400 μm square and 2 mm square and thereafter the p-side electrode of each chip was bonded to a conductive body by a solder layer of AuSn. Furthermore, the n-side electrode of each chip was bonded to a conductive body by a wire to obtain a semiconductor device having a configuration as an LED.

The optical output of each LED thus obtained was measured under conditions of injected currents of 20 mA, 40 mA, and 4 A with an integrating sphere. The optical output of the light emitting device was measured as follows. The predetermined electric current was injected into the light emitting device located in the integrating sphere and light collected from the light emitting device was measured with a detector arranged to receive the light. Devices having the two chip sizes of 400 μm square and 2 mm square were fabricated as light emitting devices corresponding to respective semiconductor substrates and the electric current of 20 mA, 40 mA, or 4 A was injected according to each of the chip sizes. The results were put together in the table of FIG. 13.

Among Samples 1-13 shown in the table of FIG. 13, good device characteristics (optical outputs) were achieved with Samples 3-11 in which the oxygen amount was in the range of not less than 3.0 at % and not more than 15.0 at % and the chlorine amount was in the range of not less than $200\times10^{10}$ atoms/cm$^2$ and not more than $12000\times10^{10}$ atoms/cm$^2$. On the other hand, Samples 1 and 2 showed lower optical outputs because either of the oxygen amount and the chlorine amount was too small; Samples 12 and 13 showed lower optical outputs because either of the oxygen amount and the chlorine amount was too large. The reduction in optical output was more prominent, particularly, with injection of the larger electric current.

According to the results of the SIMS analysis, Sample 2 had the concentration of Cl atoms of $2\times10^{15}$ atoms/cm$^3$, the concentration of O atoms of $2\times10^{16}$ atoms/cm$^3$, the concentration of Si atoms of $1\times10^{20}$ atoms/cm$^3$, and the concentration of H atoms of $1\times10^{17}$ atoms/cm$^3$. Sample 3 had the concentration of Cl atoms of $5\times10^{15}$ atoms/cm$^3$, the concentration of O atoms of $5\times10^{16}$ atoms/cm$^3$, the concentration of Si atoms of $5\times10^{19}$ atoms/cm$^3$, and the concentration of H atoms of $2\times10^{17}$ atoms/cm$^3$. Sample 6 had the concentration of Cl atoms of $1\times10^{17}$ atoms/cm$^3$, the concentration of O atoms of $2\times10^{17}$ atoms/cm$^3$, the concentration of Si atoms of $5\times10^{17}$ atoms/cm$^3$, and the concentration of H atoms of $5\times10^{17}$ atoms/cm$^3$. Sample 9 had the concentration of Cl atoms of $1\times10^{18}$ atoms/cm$^3$, the concentration of O atoms of $1\times10^{18}$ atoms/cm$^3$, the concentration of Si atoms of $1\times10^{19}$ atoms/cm$^3$, and the concentration of H atoms of $1\times10^{18}$ atoms/cm$^3$. Sample 13 had the concentration of Cl atoms of $1\times10^{19}$ atoms/cm$^3$, the concentration of O atoms of $1\times10^{19}$ atoms/cm$^3$, the concentration of Si atoms of $1\times10^{20}$ atoms/cm$^3$, and the concentration of H atoms of $5\times10^{18}$ atoms/cm$^3$.

Good device characteristics were achieved with Sample 3, Sample 6, and Sample 9 the composition at the interface of which was in the good range. The optical outputs were lower with Sample 2 and Sample 13 the composition at the interface of which was not in the good range.

Example 2

An n-type GaN crystal grown by the flux method was used for Samples 14-19 shown in the table of FIG. 14. The slicing and lapping were carried out in the same manner as in Example 1. The surface roughnesses and scratch densities were controlled by carrying out selection of grain sizes of Al$_2$O$_3$ abrasive grains in the CMP and carrying out CMP with SiO$_2$ abrasive grains as a post-step. The grain sizes of the Al$_2$O$_3$ abrasive grains were 0.5 μm for Sample 15, 1 μm for Sample 16, 2 μm for Sample 17, 4 μm for Sample 18, and 5 μm for Sample 19. Sample 14 was prepared by first carrying out the CMP with Al$_2$O$_3$ abrasive grains having the grain size of 1 μm and thereafter carrying out CMP with colloidal silica having the grain size of 50 nm. A content of silica was 10 wt %. The abrasive-free polishing was carried out in the same manner as in Example 1. Good device characteristics were achieved with Samples 14-17 the composition of the surface layer of which was in the appropriate range and the surface roughnesses of which were in the good ranges. With Samples 18 and 19 having the large surface roughnesses, the surface roughnesses of the epitaxial layer became larger and the PL intensity was lower. In addition, the optical outputs of those LEDs were lower. Good device characteristics were achieved with Samples 14 to 16 the scratch density of which was in the good range. With Samples 17 to 19 having the high scratch density, the surface roughnesses of the epitaxial layer became larger and the PL density was lower. For this reason, the optical outputs of those LEDs were lower.

Example 3

Figure 12:
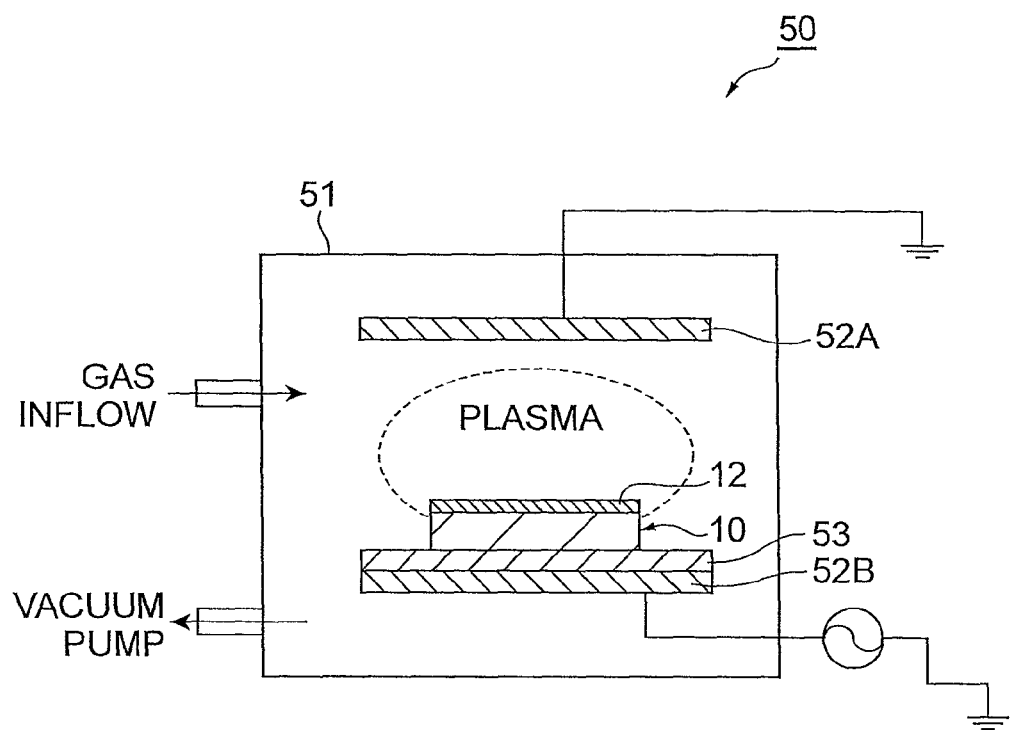
FIG. 12 is a schematic configuration diagram of a dry etching system according to an embodiment of the present invention.

For Samples 20-23 shown in the table of FIG. 15, an AlGaN substrate containing Al 5% was grown by the HVPE method, and was subjected to the CMP, followed by a surface treatment by dry etching (DE). The CMP was carried out in the same manner as in the case of Sample 14. As shown in FIG. 12, a DE system 50 used was an RIE (Reactive Ion Etching) system having electrodes 52A, 52B of a parallel plane plate type in a vacuum chamber 51. The volume of the vacuum chamber 51 was 20 L. A material of a substrate support table 53 was SiC. An etching gas was Cl$_2$ and a flow rate thereof was 30 sccm. The dry etching was carried out with the power of not less than 50 W and not more than 200 W under an atmosphere of pressure of 4.0 Pa. (PV/Q=2.67) Good device characteristics were achieved with Samples 20 to 22 the composition of the surface layer of which was in the appropriate range and the pit density of which was good. With Sample 23 having the large pit density, the surface roughnesses of the epitaxial layer became larger and the PL intensity was lower. For this reason, the optical output of the LED was lower.

Example 4

An AN substrate grown by the sublimation method was used for Samples 24 to 27 shown in the table of FIG. 16. The CMP was carried out in the same manner as in the case of Sample 14 and a surface treatment by dry etching was carried out after the CMP. The system used was the one having the same configuration as in the case of Sample 20. An etching gas was BCl$_3$ and a flow rate thereof was 50 sccm. The dry etching was carried out with the power of not less than 50 W and not more than 150 W under an atmosphere of pressure of 3.0 Pa. (PV/Q=1.2) Good device characteristics were achieved with Samples 24 to 26 the composition of the surface layer of which was in the appropriate range and the thickness of the affected layer of which was good. With Sample 27 having the large thickness of the affected layer, the surface roughnesses of the epitaxial layer became larger and the PL intensity was lower. For this reason, the optical output of the LED was lower.

Example 5

For Samples 28 to 31 shown in the table of FIG. 17, an n-type GaN crystal (dopant: O) having a principal surface of the M plane was used as an underlying substrate and an n-type GaN crystal (dopant: O) having a principal surface of the M plane was grown thereon by the HVPE method. The crystal was sliced with an inclination of 15° from the principal surface of the crystal toward the (0001) plane to obtain an n-type GaN crystal substrate having the off-angle of 15° from the M plane. (The inclination is 75° from the C plane toward the M plane.) The size of the substrate was 50 mm in diameter×0.5 mm in thickness. This substrate was subjected to CMP with $Cr_2O_3$ abrasive grains and thereafter to CMP with $SiO_2$ abrasive grains. The grain size of the $Cr_2O_3$ abrasive grains was 1 μm and a concentration of the abrasive grains was 10%. The grain size of the $SiO_2$ abrasive grains was 100 nm and a concentration of the abrasive grains was 15%. The both slurries were prepared by adding $H_2O_2$ as an oxidant and HCl as a pH adjuster to adjust pH in the range of not less than 1 and not more than 2 and the oxidation-reduction potential in the range of not less than 950 mV and not more than 1050 mV. The abrasive-free polishing was carried out using the same machine and solution as in Example 1. The polishing pad used was one of hard polyurethane (compression rate 1.5%). The polishing conditions were the same as in Example 1. Good device characteristics were achieved with Samples 28 to 30 the composition of the surface layer of which was in the appropriate range and the latent scratch density of which was good. With Sample 31 having the large latent scratch density, the surface roughnesses of the epitaxial layer became larger and the PL intensity was lower. For this reason, the optical output of the LED was lower.

Example 6

For Samples 32 to 35 shown in the table of FIG. 18, a GaN substrate having the stripe structure consisting of high dislocation density regions and low dislocation density regions linearly and alternately arranged was used and was subjected to CMP with $ZrO_2$ abrasive grains and thereafter to CMP with $Fe_2O_3$ abrasive grains. The grain size of the $ZrO_2$ abrasive grains was 500 nm and a concentration of the abrasive grains was 10%. The grain size of the $Fe_2O_3$ abrasive grains was 500 nm and a concentration of the abrasive grains was 5%. The both slurries were prepared by adding sodium hypochlorite as an oxidant and malic acid as a pH adjuster to adjust pH in the range of not less than 2 and not more than 3 and the oxidation-reduction potential in the range of not less than 1300 mV and not more than 1400 mV. The abrasive-free polishing was carried out using the same machine and solution as in Example 1. The polishing pad used was a suede pad (compression rate 12%). The polishing machine used was the same as in Example 1. The polishing pressure was not less than 15 kPa (150 gf/cm$^2$) and not more than 88 kPa (900 gf/cm$^2$) and the numbers of rotations of the n-type GaN crystal substrate and the polishing pad both were not less than 40 rotations/min and not more than 80 rotations/min. Good device characteristics and yields were achieved with Samples 33-35 the composition of the surface layer of which was in the appropriate range and the flat surface region rate of which was good. With Sample 32 having the small flat surface region rate, the optical output of the LED was lower. Furthermore, the yield was also lower.

Example 7

For Samples 36 to 47 shown in the table of FIG. 19, a substrate after the same CMP treatment as in the case of Sample 15 was subjected to a dry etching process to etch the surface of the GaN substrate, using an ICP-RIE system. An etching gas used was $Cl_2$. The volume V of a processing chamber of a facility used, the pressure P of dry etching, the gas flow rate Q, PV/Q calculated therefrom, bias power, antenna power, and the material of the substrate support table were provided in the table. A good surface layer was formed in Samples 36 and 37 the value of PV/Q of which was appropriate and the substrate support table of which was the Si-based compound of SiC or $Si_3N_4$. Sample 38 the material of the support table of which was Si had a problem of increase in the Si amount in the surface layer. Sample 39 the material of the support table of which was $Al_2O_3$ excluding Si had a problem of increase in the roughnesses of the surface layer. Samples 38 and 39 showed reduction in the optical outputs of the LEDs.

A good surface layer was obtained in Samples 41 to 46 the substrate support table of which was SiC or $Si_3N_4$ and PV/Q of which was appropriate. Good device characteristics were achieved with the samples using the compound semiconductor substrate with the good surface layer. Sample 40 the substrate support table of which was SiC and PV/Q of which was small had a problem of decrease in the oxygen amount and increase in the chlorine amount in the surface layer. The roughness of the surface layer was also larger. Sample 47 the substrate support table of which was $Si_3N_4$ and PV/Q of which was large had a problem of increase in the oxygen amount and decrease in the chlorine amount in the surface layer. Samples 40 and 47 showed reduction in the optical outputs of the LEDs.

Example 8

For Samples 48 to 58 shown in the table of FIG. 20, an n-type GaN substrate (dopant: Si) having the square structure consisting of high dislocation density regions and low dislocation density regions alternately arranged and high dislocation density regions and low dislocation density regions perpendicularly and alternately arranged was grown by the HVPE method. The substrate was lapped with diamond abrasive grains having the grain size of 2 μm and a tin platen and thereafter the substrate was polished with a solution free from the abrasive grains as shown in the table, for Samples 48 to 56. Ultrasonic cleaning was carried out for Samples 57 and 58. The solutions all had the viscosity of 10 mPa·s. The surface layer of a good composition was obtained in Samples 49-52 and Samples 54-58 the pH and the oxidation-reduction potential of the solution of which were in the appropriate ranges. Sample 48 the pH of the solution of which was lower than 1, showed increase in the oxygen amount and the chlorine amount in the surface. Furthermore, the surface roughnesses increased. Sample 53 the pH of which was higher than 6 showed reduction in the oxygen amount and the chlorine amount in the surface.

Example 9

For Samples 59 to 67 shown in the table of FIG. 21, an n-type GaN substrate (dopant: O) having the dot structure having high dislocation density regions regularly arrayed in a dot pattern was grown by the HVPE method. The GaN substrate was lapped with diamond abrasive grains having the grain size of 3 μm and a tin-2% bismuth alloy platen and thereafter the substrate was polished with a solution free from the abrasive grains as shown in the table, for Samples 59 to 64. Ultrasonic cleaning was carried out for Samples 65 to 67. The solutions all had the viscosity of 20 mPa·s. The surface layer of a good composition was obtained in Samples 60 to 63 the pH and the oxidation-reduction potential of the solution of which were in the appropriate ranges. Sample 59 the pH of the solution of which was lower than 8.5 showed decrease in the oxygen amount and the chlorine amount in the surface. Sample 64 the oxidation-reduction potential of the solution of which was high showed increase in the oxygen amount and the chlorine amount in the surface. Furthermore, the flat surface region rate was lower.

Example 10

For Samples 68 to 81 shown in the table of FIG. 22, an n-type AlGaN substrate having the stripe structure consisting of high dislocation density regions and low dislocation density regions linearly and alternately arranged was grown by the HVPE method. The substrate was lapped with SiC abrasive grains and a nonwoven fabric pad and thereafter the surface of the substrate was polished with a solution free from the abrasive grains, with a pad, and in the condition as shown in the table. The solution for all samples had the viscosity of 30 mPa·s. The surface layer of a good composition was obtained because the pH and the oxidation-reduction potential of the solution were in the appropriate ranges. Good surface roughnesses and flat surface region rates were achieved with Samples 69-73 and Samples 76-80 the compression rate of the pad and the pressure of which were in the appropriate ranges. Sample 70 the compression rate of the pad of which was lower showed increase in the surface roughnesses. Sample 74 the compression rate of the pad of which was higher showed decrease in the flat surface region rate. Sample 75 the pressure of which was lower showed increase in the Si amount because of residual SiC abrasive grains. Sample 81 the pressure of which was higher showed increase in the surface roughnesses and decrease in the flat surface region rate.

Example 11

An n-type GaN crystal (dopant: O) grown by the HVPE method was sliced along a face parallel to the (0001) plane to obtain an n-type GaN crystal substrate of 100 mm in diameter×0.8 mm in thickness. The lapping and CMP process were carried out in the same manner as in the case of Sample 15. Thereafter, abrasive-free polishing was carried out using polishing solutions with the viscosities shown in the table of FIG. 23. The viscosities of the polishing solutions were adjusted by an additive amount of boehmite. The polishing solutions were prepared by adding TCIA as an oxidant and malic acid as a pH adjuster to adjust pH to 2 and the oxidation-reduction potential to 1400 mV. The surface layer of a good composition was obtained in Samples 83 to 87 the viscosity of the polishing solution of which was in the appropriate range. Sample 82 the viscosity of the polishing solution of which was lower than 2 mPa·s showed increase in the oxygen amount and the chlorine amount in the surface. Furthermore, the surface roughnesses increased. Sample 88 the viscosity of the solution of which was higher than 30 mPa·s showed decrease in the oxygen amount and the chlorine amount in the surface.

The present invention is not limited to the above embodiments but can be modified in various ways. For example, the semiconductor substrate and epitaxial layer are not limited to GaN and AlN but may be made of any other semiconductor material as long as they are comprised of a Group III nitride semiconductor.

The invention claimed is:

1. A compound semiconductor substrate comprised of a Group III nitride and having a surface containing a chloride of not less than $200×10^{10}$ atoms/cm$^2$ and not more than $12000×10^{10}$ atoms/cm$^2$ in terms of Cl and an oxide of not less than 3.0 at % and not more than 15.0 at % in terms of O, at a surface.

2. The compound semiconductor substrate according to claim 1, wherein the surface contains the chloride of not less than $300×10^{10}$ atoms/cm$^2$ and not more than $8000×10^{10}$ atoms/cm$^2$ in terms of Cl.

3. The compound semiconductor substrate according to claim 1, wherein the surface contains the oxide of not less than 5.0 at % and not more than 12.0 at % in terms of O.

4. The compound semiconductor substrate according to claim 1, wherein a surface roughness (RMS) of the surface is not more than 3 nm.

5. The compound semiconductor substrate according to claim 1, wherein a surface roughness (RMS) of the surface is not more than 1 nm.

6. The compound semiconductor substrate according to claim 1, wherein the surface has a structure in which low dislocation density regions and high dislocation density regions are alternately arranged.

7. The compound semiconductor substrate according to claim 1, further comprising an epitaxial layer formed on the surface and comprised of a Group III nitride.

8. The compound semiconductor substrate according to claim 1, wherein a plane direction of the surface is one of the (0001) plane, (11-20) plane, (10-12) plane, (10-10) plane, (20-21) plane, (10-11) plane, (11-21) plane, (11-22) plane, and (11-24) plane of the wurtzite structure.

9. The compound semiconductor substrate according to claim 1, wherein the surface has an off-angle of not more than 15° relative to one of the (0001) plane, (11-20) plane, (10-12) plane, (10-10) plane, (20-21) plane, (10-11) plane, (11-21) plane, (11-22) plane, and (11-24) plane of the wurtzite structure.

* * * * *